US012796432B2

(12) United States Patent
Uno

(10) Patent No.: US 12,796,432 B2
(45) Date of Patent: Nov. 10, 2026

(54) INTEGRATED CIRCUIT APPARATUS AND OSCILLATOR

(71) Applicant: SEIKO EPSON CORPORATION, Tokyo (JP)

(72) Inventor: Tomohiro Uno, Chino (JP)

(73) Assignee: SEIKO EPSON CORPORATION (JP)

( * ) Notice: Subject to any disclaimer, the term of this patent is extended or adjusted under 35 U.S.C. 154(b) by 358 days.

(21) Appl. No.: 18/743,862

(22) Filed: Jun. 14, 2024

(65) Prior Publication Data

US 2024/0421091 A1 Dec. 19, 2024

(30) Foreign Application Priority Data

Jun. 16, 2023 (JP) ................................. 2023-099036

(51) Int. Cl.

*H10W 20/20* (2026.01)
*H03B 5/36* (2006.01)
*H10W 40/00* (2026.01)

(52) U.S. Cl.

CPC .............. *H10W 20/20* (2026.01); *H03B 5/36* (2013.01); *H10W 40/00* (2026.01)

(58) Field of Classification Search

CPC .......... H01L 23/535; H01L 23/34; H03B 5/36
See application file for complete search history.

(56) References Cited

U.S. PATENT DOCUMENTS

| | | | | |
|---|---|---|---|---|
| 7,362,193 B2 * | 4/2008 | Mattisson | H03B 5/36 331/158 |
| 2015/0180443 A1 | 6/2015 | Hayashi et al. | |
| 2015/0180444 A1 | 6/2015 | Hayashi et al. | |
| 2022/0294391 A1 | 9/2022 | Uno | |
| 2024/0048100 A1 * | 2/2024 | Itasaka | H03B 5/36 |
| 2024/0356490 A1 * | 10/2024 | Wada | H03B 5/04 |

FOREIGN PATENT DOCUMENTS

| | | |
|---|---|---|
| JP | 2015-122219 A | 7/2015 |
| JP | 2015-122426 A | 7/2015 |
| JP | 2022-138842 A | 9/2022 |
| JP | 2022-138843 A | 9/2022 |

* cited by examiner

*Primary Examiner* — Walter L Lindsay, Jr.
(74) *Attorney, Agent, or Firm* — Harness, Dickey & Pierce, P.L.C.

(57) ABSTRACT

An integrated circuit apparatus includes a first pad to which one of a power supply voltage and a ground voltage is supplied, a second pad to which the other of the power supply voltage and the ground voltage is supplied, a first transistor having a first gate to which a temperature control signal is input, a first drain electrically coupled to the first pad, and a first source electrically coupled to the second pad, a first drain coupling via wire that is a via wire electrically coupling the first pad to the first drain, and a first source coupling via wire that is a via wire electrically coupling the second pad to the first source. In plan view, the first drain overlaps the first pad and the first source overlaps the second pad.

13 Claims, 13 Drawing Sheets

INTEGRATED CIRCUIT APPARATUS AND OSCILLATOR

The present application is based on, and claims priority from JP Application Serial Number 2023-099036, filed Jun. 16, 2023, the disclosure of which is hereby incorporated by reference herein in its entirety.

BACKGROUND

1. Technical Field

The present disclosure relates to an integrated circuit apparatus and an oscillator.

2. Related Art

JP-A-2022-138842 describes an integrated circuit apparatus that includes a heat generating circuit including a heat generating transistor coupled between a power supply pad and a ground pad and in which a resistance value of a source of the heat generating transistor is smaller than a resistance value of a drain of the heat generating transistor such that a reduction in heat generation performance due to parasitic resistance of the heat generating transistor is suppressed.

In the integrated circuit apparatus described in JP-A-2022-138842, current that flows in the heat generating transistor may decrease due to parasitic resistance in a diffusion layer between the power supply pad and the drain of the heat generating transistor and parasitic resistance in a diffusion layer between the source of the heat generating transistor and the ground pad.

SUMMARY

According to an aspect of the present disclosure, an integrated circuit apparatus includes a first pad to which one of a power supply voltage and a ground voltage is supplied, a second pad to which the other of the power supply voltage and the ground voltage is supplied, a first transistor having a first gate to which a temperature control signal is input, a first drain electrically coupled to the first pad, and a first source electrically coupled to the second pad, a first drain coupling via wire that is a via wire electrically coupling the first pad to the first drain, and a first source coupling via wire that is a via wire electrically coupling the second pad to the first source. In plan view, the first drain overlaps the first pad and the first source overlaps the second pad.

According to another aspect of the present disclosure, an oscillator includes an integrated circuit apparatus, a resonator element whose temperature is controlled by the integrated circuit apparatus, and an oscillation circuit that causes the resonator element to oscillate. The integrated circuit apparatus includes a first pad to which one of a power supply voltage and a ground voltage is supplied, a second pad to which the other of the power supply voltage and the ground voltage is supplied, a first transistor having a first gate to which a temperature control signal is input, a first drain electrically coupled to the first pad, and a first source electrically coupled to the second pad, a first drain coupling via wire that is a via wire electrically coupling the first pad to the first drain, and a first source coupling via wire that is a via wire electrically coupling the second pad to the first source. In plan view, the first drain overlaps the first pad and the first source overlaps the second pad.

DESCRIPTION OF EMBODIMENTS

Hereinafter, embodiments of the present disclosure are described with reference to the drawings. The embodiments described below do not unduly limit the scope of the claims herein. In addition, not all configurations described below are essential configuration requirements for the present disclosure.

1. Integrated Circuit Apparatus

1-1. First Embodiment

Figure 1:
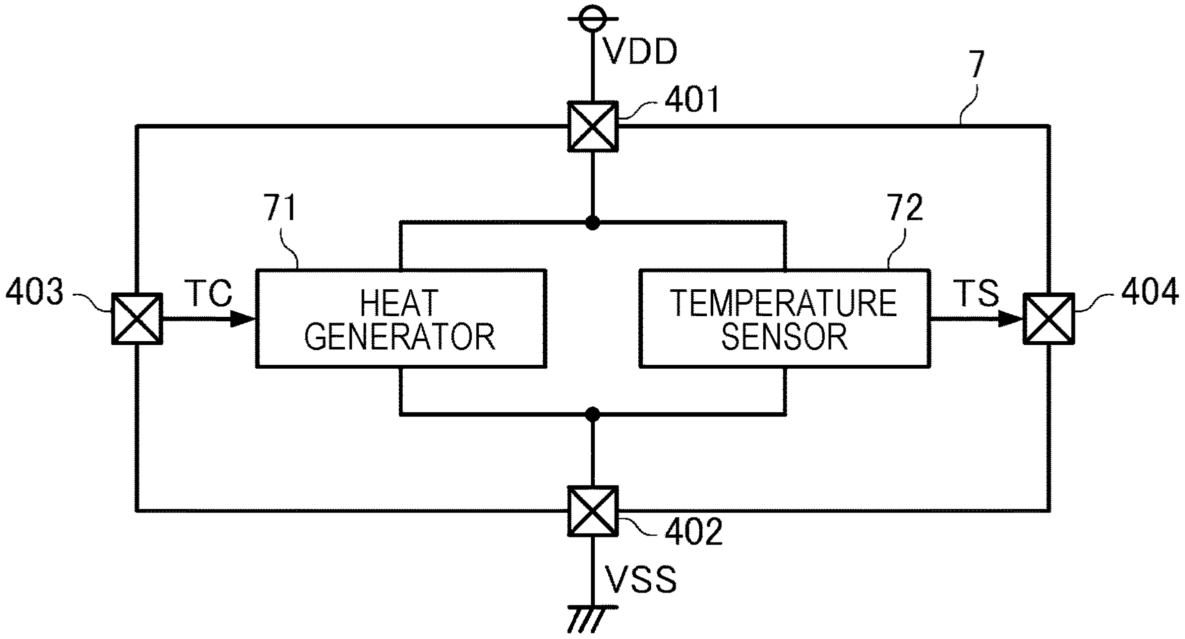
FIG. 1 is a functional block diagram of an integrated circuit apparatus according to a first embodiment.

FIG. 1 is a functional block diagram of an integrated circuit apparatus according to a first embodiment. As illustrated in FIG. 1, the integrated circuit apparatus 7 according to the first embodiment includes a heat generator 71 and may further include a temperature sensor 72.

The integrated circuit apparatus 7 includes pads 401, 402, 403, and 404 that are electrodes for external coupling. The pads 401, 402, 403, and 404 may be pads for wire bonding implementation or may be pads for flip chip implementation. The pad 401 is coupled to a power supply, and a power supply voltage VDD is supplied to the pad 401. The pad 402 is coupled to the ground, and a ground voltage VSS is supplied to the pad 402. The pads 403 and 404 are coupled to, for example, a control device not illustrated. A temperature control signal TC is input to the pad 403. The pad 404 outputs a temperature detection signal TS that is an output signal from the temperature sensor 72.

The heat generator 71 is coupled between the power supply and the ground via the pads 401 and 402 and generates heat due to current flowing from the power supply toward the ground. The amount of heat generated by the heat generator 71 changes according to a voltage level of the temperature control signal TC. The integrated circuit apparatus 7 is a heat generating integrated circuit (IC) that generates heat by the heat generator 71.

The temperature sensor 72 is coupled between the power supply and the ground via the pads 401 and 402. The temperature sensor 72 detects a temperature of the integrated circuit apparatus 7 and outputs the temperature detection signal TS having a voltage level corresponding to the detected temperature. Since the integrated circuit apparatus 7 has the built-in heat generator 71, the temperature sensor 72 detects the temperature of the inside of the integrated circuit apparatus 7. The temperature of the inside of the integrated circuit apparatus 7 changes according to heat generated by the heat generator 71. For example, the temperature sensor 72 may be a sensor that uses temperature dependence of a forward voltage of a PN junction of a diode. The temperature detection signal TS is output from the temperature sensor 72 through the pad 404 to the outside of the integrated circuit apparatus 7.

Figure 2:
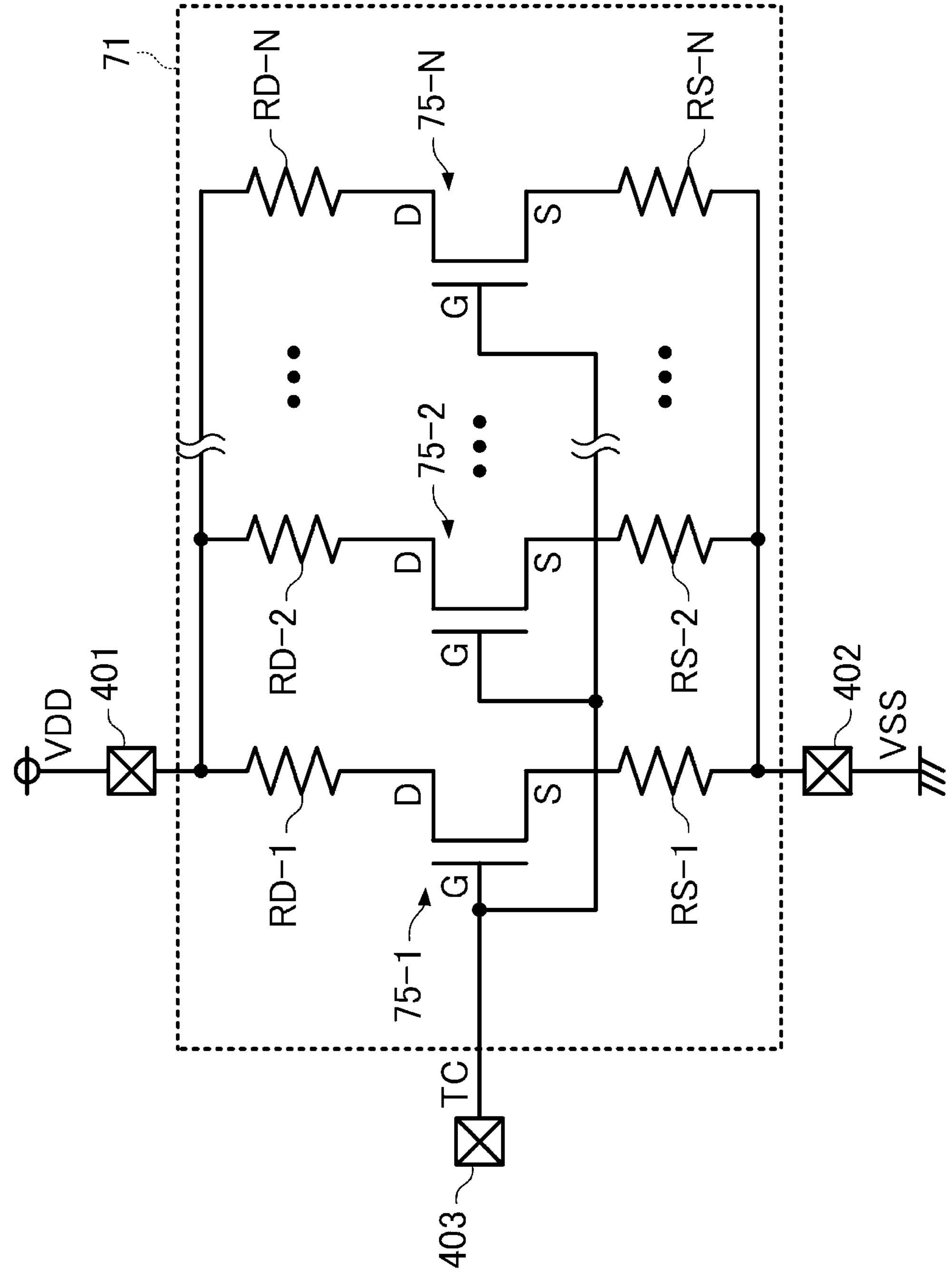
FIG. 2 is a diagram illustrating a circuit configuration of a heat generator according to the first embodiment.

FIG. 2 is a diagram illustrating a circuit configuration of a heat generator 71 according to the first embodiment. As illustrated in FIG. 2, the heat generator 71 includes a transistor 75-1. The transistor 75-1 is an N-channel metal-oxide-semiconductor (MOS) transistor and includes a gate G, a drain D, and a source S. The temperature control signal TC is input to the gate G of the transistor 75-1. The drain D is electrically coupled to the pad 401, and the source S is electrically coupled to the pad 402. Actually, parasitic resistance RD-1 is formed between the drain D of the transistor 75-1 and the pad 401, and parasitic resistance RS-1 is formed between the source S of the transistor 75-1 and the pad 402. The parasitic resistance RD-1 and the parasitic resistance RS-1 are formed due to resistance of each wiring layer, resistance of an N+ diffusion layer, and the like.

As illustrated in FIG. 2, the heat generator 71 may further include transistors 75-2 to 75-N. N is an integer of 2 or greater.

For each integer i greater than or equal to 2 and less than or equal to N, the transistor 75-*i* is an N-channel MOS transistor and includes a gate G, a drain D, and a source S. The temperature control signal TC is input to the gate G of the transistor 75-*i*. The drain D of the transistor 75-*i* is electrically coupled to the pad 401, and the source S of the transistor 75-*i* is electrically coupled to the pad 402. Actually, parasitic resistance RD-i is formed between the drain D of the transistor 75-*i* and the pad 401, and parasitic resistance RS-i is formed between the source S of the transistor 75-*i* and the pad 402. The parasitic resistance RD-i and the parasitic resistance RS-i are formed due to the resistance of each wiring layer, the resistance of the N+ diffusion layer, and the like.

That is, the heat generator 71 may include the number N of transistors 75-1 to 75-N coupled in parallel between the pad 401 and the pad 402, and the temperature control signal TC may be commonly input to each of the gates G of the transistors 75-1 to 75-N.

Each of the transistors 75-1 to 75-N is an N-channel MOS transistor. Therefore, in each of the transistors 75-1 to 75-N, as the voltage level of the temperature control signal TC input to the gate G increases, on-resistance decreases and a drain current increases. Power consumed by each of the transistors 75-1 to 75-N is represented by a product of the drain current squared and the on-resistance and is released as heat from each of the transistors 75-1 to 75-N. Therefore, the higher the voltage level of the temperature control signal TC, the larger the amount of heat generated by each of the transistors 75-1 to 75-N.

However, as the parasitic resistance RD-1 to RD-N and the parasitic resistance RS-1 to RS-N increase, the drain currents of the transistors 75-1 to 75-N decrease and the amount of heat generated by the heat generator 71 including the transistors 75-1 to 75-N decreases. To avoid this, in the present embodiment, devising a layout of the integrated circuit apparatus 7 reduces the parasitic resistance RD-1 to RD-N and RS-1 to RS-N and improves the heat generation efficiency of the heat generator 71.

Figure 3:
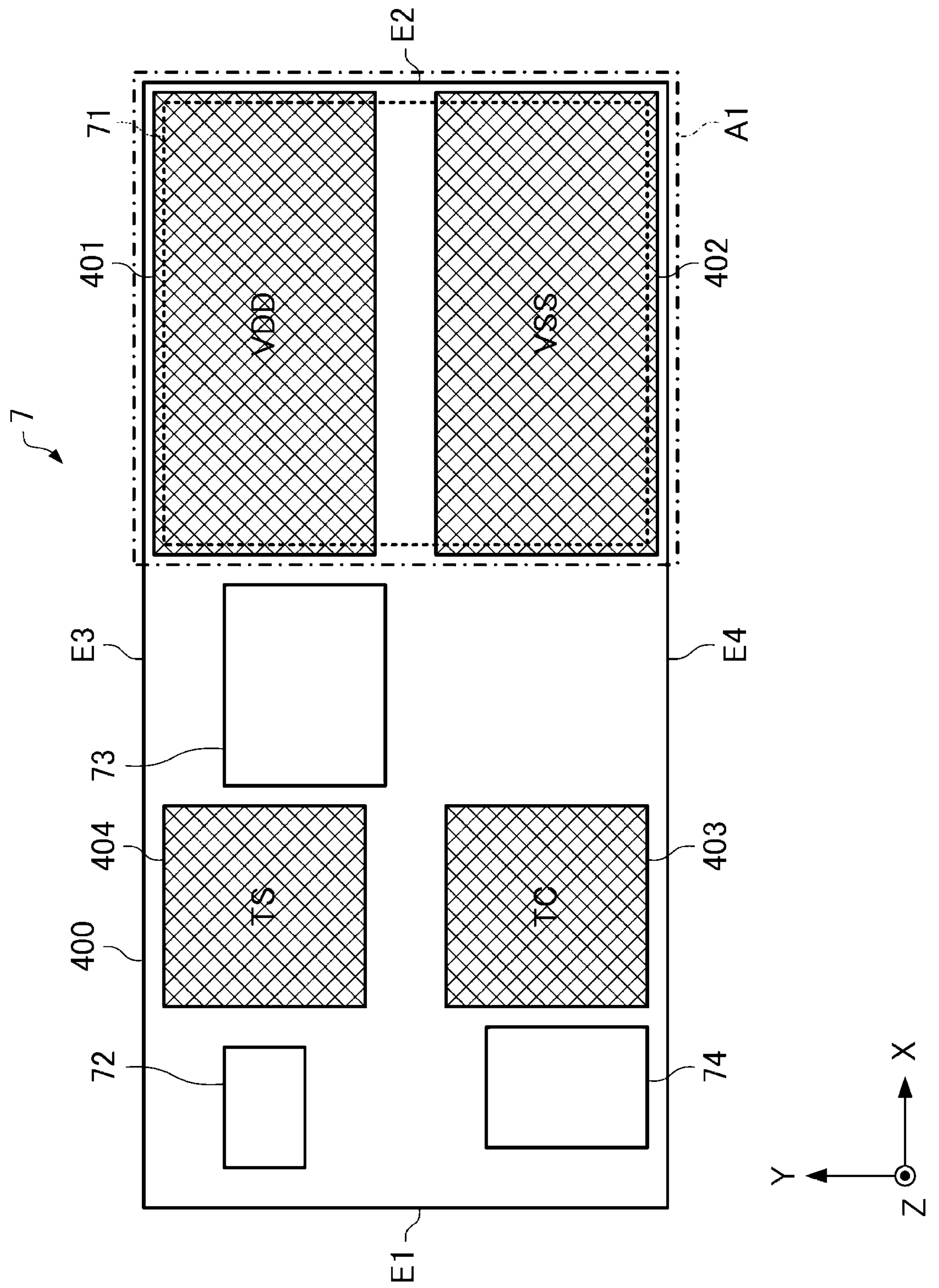
FIG. 3 is a plan view illustrating an example of a layout of the integrated circuit apparatus.
Figure 4:
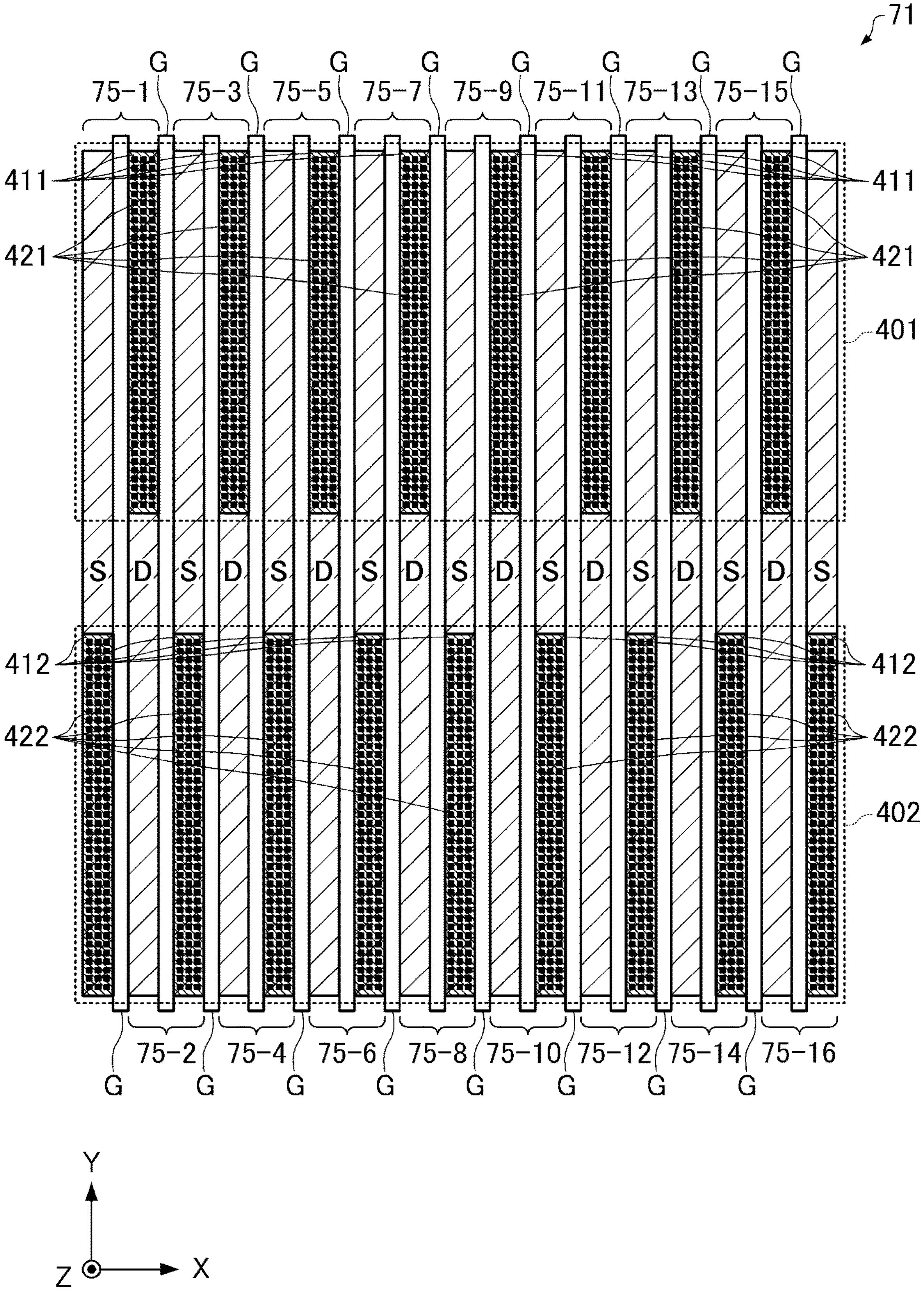
FIG. 4 is a diagram illustrating a layout of the heat generator according to the first embodiment.
Figure 5:
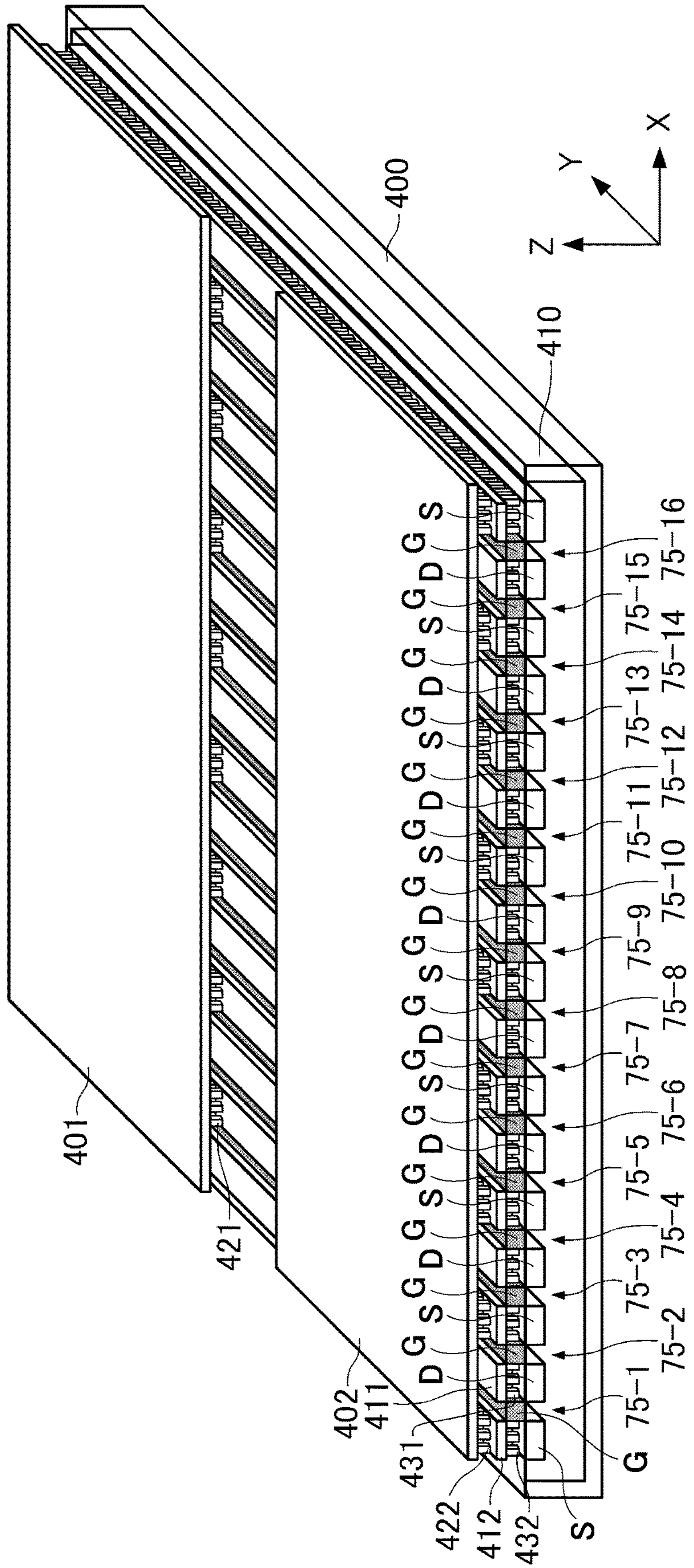
FIG. 5 is a perspective view of a region of an integrated circuit apparatus according to the first embodiment.

FIG. 3 is a plan view illustrating an example of the layout of the integrated circuit apparatus 7. FIG. 4 is a diagram illustrating a detailed layout of the heat generator 71. FIG. 4 illustrates the pads 401 and 402 using broken lines. FIG. 5 is a perspective view of a region A1 of the integrated circuit apparatus 7 illustrated in FIG. 3. In FIGS. 3, 4, and 5, X, Y, and Z directions that are three directions perpendicular to each other are illustrated in order to determine a viewing direction. FIGS. 4 and 5 illustrate a case where the integer N in FIG. 2 is 16, that is, a case where the heat generator 71 includes 16 transistors 75-1 to 75-16 as an example.

As illustrated in FIG. 3, the integrated circuit apparatus 7 is rectangular in plan view and has a first side E1, a second side E2 opposite to the first side E1, a third side E3, and a fourth side E4 opposite to the third side E3. The first side E1 and the second side E2 are short sides, while the third side E3 and the fourth side E4 are long sides. The first side E1 and the second side E2 are parallel to the Y direction. The third side E3 and the fourth side E4 are parallel to the X direction.

The integrated circuit apparatus 7 includes a semiconductor substrate 400. Each element and each wire are stacked on the semiconductor substrate 400. In the present embodiment, the semiconductor substrate 400 is an N-type semiconductor substrate formed by mixing impurities such as phosphorus (P) into a silicon substrate. The semiconductor substrate 400 may have a rectangular shape, and four sides of the semiconductor substrate 400 may correspond to the first side E1, the second side E2, the third side E3, and the fourth side E4 of the integrated circuit apparatus 7.

As illustrated in FIG. 3, in a second direction intersecting a first direction that is a longitudinal direction of each of the gate G, the drain D, and the source S of the transistor 75-1, one of the pads 401 and 402 and the pad 404 are arranged side by side. In the second direction, the other of the pads 401 and 402 and the pad 403 are arranged side by side. In FIG. 3, the first direction is the Y direction, and the second direction is the X direction. In the second direction, the pad 401 and the pad 404 are arranged side by side and the pad 402 and the pad 403 are arranged side by side. However, in the second direction, the pad 402 and the pad 404 may be arranged side by side and the pad 401 and the pad 403 may be arranged side by side.

As illustrated in FIGS. 3 and 4, in the second direction, the temperature sensor 72, the pad 404, and the transistors 75-1 to 75-16 included in the heat generator 71 are arranged side by side in the order of the temperature sensor 72, the pad 404, and the transistors 75-1 to 75-16.

As illustrated in FIG. 3, the temperature sensor 72 is located closer to the first side E1 than to the second side E2. Specifically, the temperature sensor 72 is disposed along the first side E1 and the third side E3. In addition, as illustrated in FIGS. 3 and 4, the transistors 75-1 to 75-16 included in the heat generator 71 are located closer to the second side E2 than to the first side E1.

An electrostatic protection circuit 73 for the pads 401 and 402 is disposed between the pads 401 and 404. An electrostatic protection circuit 74 for the pads 403 and 404 is disposed between the pad 403 and the first side E1.

As illustrated in FIG. 3, the heat generator 71 is disposed in the region A1. As illustrated in FIG. 3, in plan view, a portion of the heat generator 71 overlaps the pad 401 and another portion of the heat generator 71 overlaps the pad 402.

As illustrated in FIGS. 4 and 5, the pad 401 and the pad 402 are arranged side by side in the first direction that is the longitudinal direction of each of the gate G, the drain D, and the source S of the transistor 75-1. For example, the first direction may be the Y direction. As illustrated in FIG. 4, the transistors 75-1 to 75-16 are arranged side by side in the second direction intersecting the first direction. For example, the second direction may be the X direction.

As illustrated in FIG. 5, in the region A1, a P-type well 410 is formed in the semiconductor substrate 400, and the transistors 75-1 to 75-16 are formed in the well 410. The gates G of the transistors 75-1 to 75-16 are formed in a polysilicon layer, and the drains D and the sources S of the transistors 75-1 to 75-16 are formed in the N+ diffusion layer. The gates G of the transistors 75-1 to 75-16 are electrically coupled to each other via polysilicon wires or metal wires not illustrated.

As illustrated in FIGS. 4 and 5, the drain D of the transistor 75-1 and the drain D of the transistor 75-2 are formed in the same region. Similarly, the drain D of the transistor 75-3 and the drain D of the transistor 75-4 are formed in the same region. Similarly, the drain D of the transistor 75-5 and the drain D of the transistor 75-6 are formed in the same region. Similarly, the drain D of the transistor 75-7 and the drain D of the transistor 75-8 are formed in the same region. Similarly, the drain D of the transistor 75-9 and the drain D of the transistor 75-10 are formed in the same region. Similarly, the drain D of the transistor 75-11 and the drain D of the transistor 75-12 are formed in the same region. Similarly, the drain D of the transistor 75-13 and the drain D of the transistor 75-14 are formed in the same region. Similarly, the drain D of the transistor 75-15 and the drain D of the transistor 75-16 are formed in the same region.

In addition, the source S of the transistor 75-2 and the source S of the transistor 75-3 are formed in the same region. Similarly, the source S of the transistor 75-4 and the source S of the transistor 75-5 are formed in the same region. Similarly, the source S of the transistor 75-6 and the source S of the transistor 75-7 are formed in the same region. Similarly, the source S of the transistor 75-8 and the source S of the transistor 75-9 are formed in the same region. Similarly, the source S of the transistor 75-10 and the source S of the transistor 75-11 are formed in the same region. Similarly, the source S of the transistor 75-12 and the source S of the transistor 75-13 are formed in the same region. Similarly, the source S of the transistor 75-14 and the source S of the transistor 75-15 are formed in the same region.

As illustrated in FIG. 4, in plan view of the integrated circuit apparatus 7, the drain D of the transistor 75-1 overlaps the pad 401, and the source S of the transistor 75-1 overlaps the pad 402. Specifically, in plan view of the integrated circuit apparatus 7, the gate G, the drain D, and the source S of the transistor 75-1 overlap the pad 401 and the pad 402. In plan view of the integrated circuit apparatus 7, in a region in which the pad 401 overlaps the drain D of the transistor 75-1, a plurality of via wires 421 electrically coupling the pad 401 to the drain D of the transistor 75-1 are formed. In addition, in plan view of the integrated circuit apparatus 7, in a region in which the pad 402 overlaps the source S of the transistor 75-1, a plurality of via wires 422 electrically coupling the pad 402 to the source S of the transistor 75-1 are formed.

Similarly, for each integer i greater than or equal to 2 and less than or equal to 16, in plan view of the integrated circuit apparatus 7, the drain D of the transistor 75-*i* overlaps the pad 401, and the source S of the transistor 75-*i* overlaps the pad 402. Specifically, in plan view of the integrated circuit apparatus 7, the gate G, the drain D, and the source S of the transistor 75-*i* overlap the pad 401 and the pad 402. In plan view of the integrated circuit apparatus 7, in a region in which the pad 401 overlaps the drain D of the transistor 75-*i*, a plurality of via wires 421 electrically coupling the pad 401 to the drain D of the transistor 75-*i* are formed. In plan view of the integrated circuit apparatus 7, in a region in which the pad 402 overlaps the source S of the transistor 75-*i*, a plurality of via wires 422 electrically coupling the pad 402 to the source S of the transistor 75-*i* are formed.

As illustrated in FIG. 5, the pads 401 and 402 are formed by metal wires in a third wiring layer that is the uppermost layer. In addition, for example, in plan view, each metal wire 411 is formed in a second wiring layer such that each metal wire 411 overlaps each of the drains D of the transistors 75-1 to 75-16. For each integer i greater than or equal to 1 and less than or equal to 16, a plurality of via wires 431 are formed to couple the drain D of the transistor 75-*i* to the metal wire 411, and a plurality of via wires 421 are formed to couple the metal wire 411 to the pad 401. Therefore, in plan view of the integrated circuit apparatus 7, in a region in which the pad 401 overlaps the drain D of the transistor 75-*i*, the plurality of via wires 421 and some of the plurality of via wires 431 are formed.

In addition, as illustrated in FIG. 5, for example, in plan view, each metal wire 412 is formed in the second wiring layer such that each metal wire 412 overlaps each of the sources S of the transistors 75-1 to 75-16. For each integer i greater than or equal to 1 and less than or equal to N, a plurality of via wires 432 are formed to couple the source S of the transistor 75-*i* to the metal wire 412 and a plurality of via wires 422 are formed to couple the metal wire 412 to the pad 402. Therefore, in plan view of the integrated circuit apparatus 7, in a region in which the pad 402 overlaps the source S of the transistor 75-*i*, the plurality of via wires 422 and some of the plurality of via wires 432 are formed.

In the integrated circuit apparatus 7 configured as illustrated in FIGS. 3, 4, and 5, current flows from the pad 401 to each of the drains D of the transistors 75-1 to 75-16 through a wiring path formed by the plurality of via wires 421, the metal wire 411, and the plurality of via wires 431. Since the wiring path through which the current flows is very short, parasitic resistance of the wiring path is very small. In addition, since the current flows from each of the drains D of the transistors 75-1 to 75-16 to each of the sources S of the transistors 75-1 to 75-16 in a lateral direction of each of the drains D and the sources S, parasitic resistance of each of the drains D of the transistors 75-1 to 75-16 and parasitic resistance of each of the sources S of the transistors 75-1 to 75-16 are small. In addition, the current flows from each of the sources S of the transistors 75-1 to 75-16 to the pad 402 through a wiring path formed by the plurality of via wires 432, the metal wire 412, and the plurality of via wires 422. Since the wiring path through which the current flows is very short, parasitic resistance of the wiring path is very small. Therefore, the parasitic resistance RD-1 to RD-16 and the parasitic resistance RS-1 to RS-16 illustrated in FIG. 2 are reduced, and thus the current that flows in each of the transistors 75-1 to 75-16 increases and the heat generation efficiency of the heat generator 71 is improved.

In the first embodiment, the pad 401 is an example of a "first pad", the pad 402 is an example of a "second pad", and the pad 404 is an example of a "third pad". In the first embodiment, the transistor 75-1 is an example of a "first transistor", the gate G, the drain D, and the source S of the transistor 75-1 are an example of a "first gate", an example of a "first drain", and an example of a "first source", respectively. In the first embodiment, the transistors 75-2 to 75-N are an example of "second to Nth transistors". In the first embodiment, for each integer i greater than or equal to 2 and less than or equal to N, the gate G, the drain D, and the source S of the transistor 75-*i* are an example of an "ith gate", an example of an "ith drain", and an example of an "ith source", respectively. In the first embodiment, each of the plurality of via wires 421 electrically coupling the pad 401 to the drain D of the transistor 75-1 is an example of a "first drain coupling via wire", and each of the plurality of via wires 422 electrically coupling the pad 402 to the source S of the transistor 75-1 is an example of a "first source coupling via wire". In the first embodiment, for each integer i greater than or equal to 2 and less than or equal to N, each of the via wires 421 electrically coupling the pad 401 to the drain D of the ith transistor 75-*i* is an example of an "ith drain coupling via wire", and each of the via wires 422 electrically coupling the pad 402 to the source S of the ith transistor 75-*i* is an example of an "ith source coupling via wire".

As described above, according to the integrated circuit apparatus 7 according to the first embodiment, current flows from the pad 401 to the drains D of the transistors 75-1 to 75-N through the plurality of via wires 421, the plurality of metal wires 411, and the plurality of via wires 431 in very short paths. The current flows from the drains D of the transistors 75-1 to 75-N to the sources S of the transistors 75-1 to 75-N through short paths and further flow from the sources S of the transistors 75-1 to 75-N to the pad 402 through the plurality of via wires 432, the plurality of metal wires 412, and the plurality of via wires 422 in very short paths. Therefore, paths through which the current flows from the pad 401 to the pad 402 are short. In addition, since the current flows in a direction orthogonal to the pads 401 and 402 between the pads 401 and 402 and the transistors 75-1 to 75-N, the cross-sectional areas of the wires through which the current flows are large. Therefore, according to the integrated circuit apparatus 7 according to the first embodiment, parasitic resistance between the pads 401 and 402 and the transistors 75-1 to 75-N is small and it is possible to reduce the possibility that the current that flows in the transistors 75-1 to 75-N may decrease due to the parasitic resistance.

According to the integrated circuit apparatus 7 according to the first embodiment, the cross-sectional areas of the wires through which the current flows between the pads 401 and 402 and the transistors 75-1 to 75-N are large. Therefore, the integrated circuit apparatus 7 according to the first embodiment is resistant to electromigration.

In addition, according to the integrated circuit apparatus 7 according to the first embodiment, in plan view, in the regions in which the pads 401 and 402 overlap the drains D and the sources S of the transistors 75-1 to 75-N, the transistors 75-1 to 75-N including the drains D and the sources S having large areas can be disposed. Thus, it is possible to increase the current that flows in the transistors 75-1 to 75-N. Therefore, it is possible to implement the integrated circuit apparatus 7 that is small in size and in which a sufficient amount of current can flow.

In addition, according to the integrated circuit apparatus 7 according to the first embodiment, the pads 401 and 402 are arranged side by side in the first direction that is the longitudinal direction of the gate G of the transistors 75-1, and the pads 401 and 402 are arranged side by side with the pads 403 and 404 in the second direction intersecting the first direction. Therefore, a dead space does not occur between the pads 401 and 404 and the third side E3 and between the pads 402 and 403 and the fourth side E4 and it is possible to easily bond the pads 401, 402, 403, and 404.

In the integrated circuit apparatus 7 according to the first embodiment, the temperature sensor is located close to the first side E1, and the transistors 75-1 to 75-N are located close to the second side E2. In the second direction, the temperature sensor 72, the pad 404, the electrostatic protection circuit 73, and the transistors 75-1 to 75-N are arranged side by side in the order of the temperature sensor 72, the pad 404, the electrostatic protection circuit 73, and the transistors 75-1 to 75-N. That is, since the temperature sensor 72 is located away from the transistors 75-1 to 75-N, it is possible to prevent the temperature to be detected by the temperature sensor 72 from rapidly changing due to a change in the amount of heat generated by the transistors 75-1 to 75-N.

1-2. Second Embodiment

In a second embodiment, configurations similar to those described in the first embodiment are denoted by the same reference signs, descriptions similar to those in the first embodiment are omitted or simplified, and details different from those described in the first embodiment are mainly described below.

Since a functional block diagram of an integrated circuit apparatus 7 according to the second embodiment is similar to FIG. 1, an illustration and description of the functional block diagram of the integrated circuit apparatus 7 according to the second embodiment are omitted.

Figure 6:
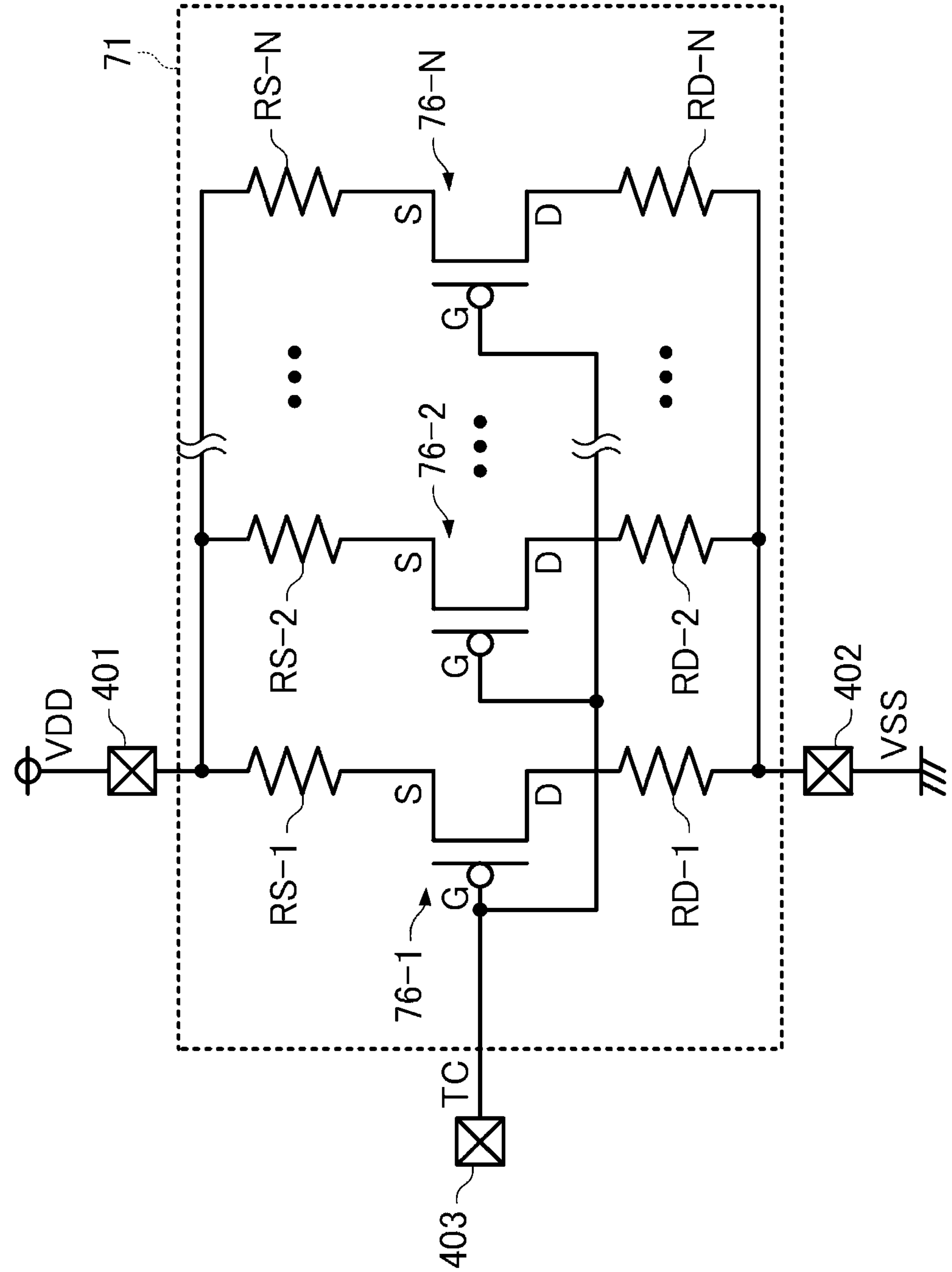
FIG. 6 is a diagram illustrating a circuit configuration of a heat generator according to a second embodiment.

FIG. 6 is a diagram illustrating a circuit configuration of a heat generator 71 according to the second embodiment. As illustrated in FIG. 6, the heat generator 71 includes a transistor 76-1. The transistor 76-1 is a P-channel MOS transistor and includes a gate G, a drain D, and a source S. A temperature control signal TC is input to the gate G of the transistor 76-1. The drain D of the transistor 76-1 is electrically coupled to a pad 402, and the source S of the transistor 76-1 is electrically coupled to a pad 401. Actually, parasitic resistance RD-1 is formed between the drain D of the transistor 76-1 and the pad 402, and parasitic resistance RS-1 is formed between the source S of the transistor 76-1 and the pad 401. The parasitic resistance RD-1 and the parasitic resistance RS-1 are formed due to resistance of each wiring layer, resistance of a P+ diffusion layer, and the like.

As illustrated in FIG. 6, the heat generator 71 may further include transistors 76-2 to 76-N. N is an integer of 2 or greater.

For each integer i greater than or equal to 2 and less than or equal to N, the transistor 76-*i* is a P-channel MOS transistor and includes a gate G, a drain D, and a source S. The temperature control signal TC is input to the gate G of the transistor 76-*i*. The drain D of the transistor 76-*i* is electrically coupled to the pad 402, and the source S of the transistor 76-*i* is electrically coupled to the pad 401. Actually, parasitic resistance RD-i is formed between the drain D of the transistor 76-*i* and the pad 402, and parasitic resistance RS-i is formed between the source S of the transistor 76-*i* and the pad 401. The parasitic resistance RD-i and the parasitic resistance RS-i are formed due to the resistance of each wiring layer, the resistance of the P+ diffusion layer, and the like.

That is, the heat generator 71 may include the number N of transistors 76-1 to 76-N coupled in parallel between the pad 401 and the pad 402, and the temperature control signal TC may be commonly input to each of the gates G of the transistors 76-1 to 76-N.

Each of the transistors 76-1 to 76-N is a P-channel MOS transistor. Therefore, in each of the transistors 76-1 to 76-N, as the voltage level of the temperature control signal TC input to the gate G decreases, on-resistance decreases and a drain current increases. Power consumed by each of the transistors 76-1 to 76-N is represented by a product of the drain current squared and the on-resistance and is released as heat from each of the transistors 76-1 to 76-N. Therefore, the higher the voltage level of the temperature control signal TC, the larger the amount of heat generated by each of the transistors 76-1 to 76-N.

However, as the parasitic resistance RD-1 to RD-N and the parasitic resistance RS-1 to RS-N increase, the drain currents of the transistors 76-1 to 76-N decrease and the amount of heat generated by the heat generator 71 including the transistors 76-1 to 76-N decreases. To avoid this, in the present embodiment, devising a layout of the integrated circuit apparatus 7 reduces the parasitic resistance RD-1 to RD-N and RS-1 to RS-N and improves the heat generation efficiency of the heat generator 71.

Figure 7:
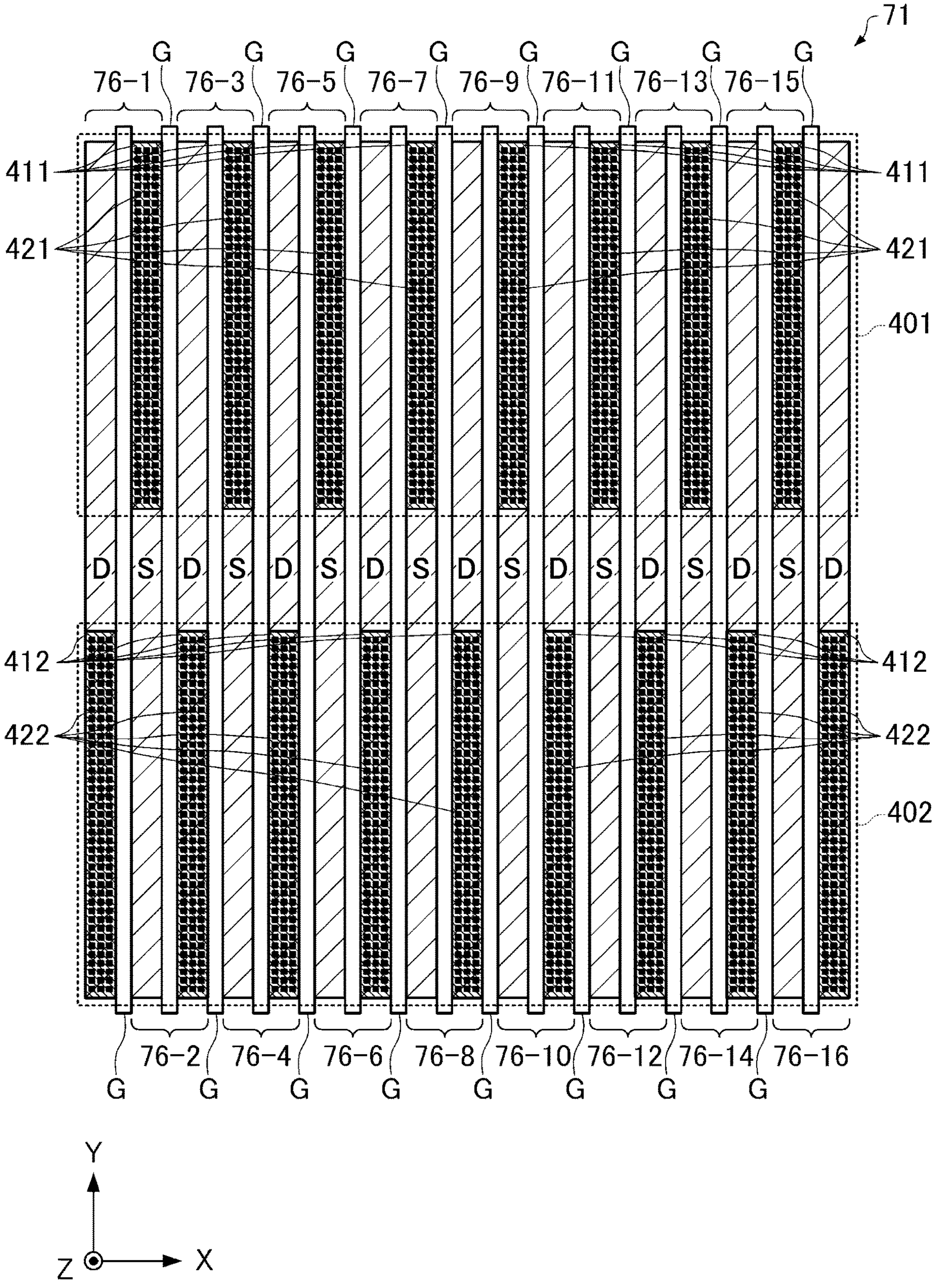
FIG. 7 is a diagram illustrating a layout of the heat generator according to the second embodiment.
Figure 8:
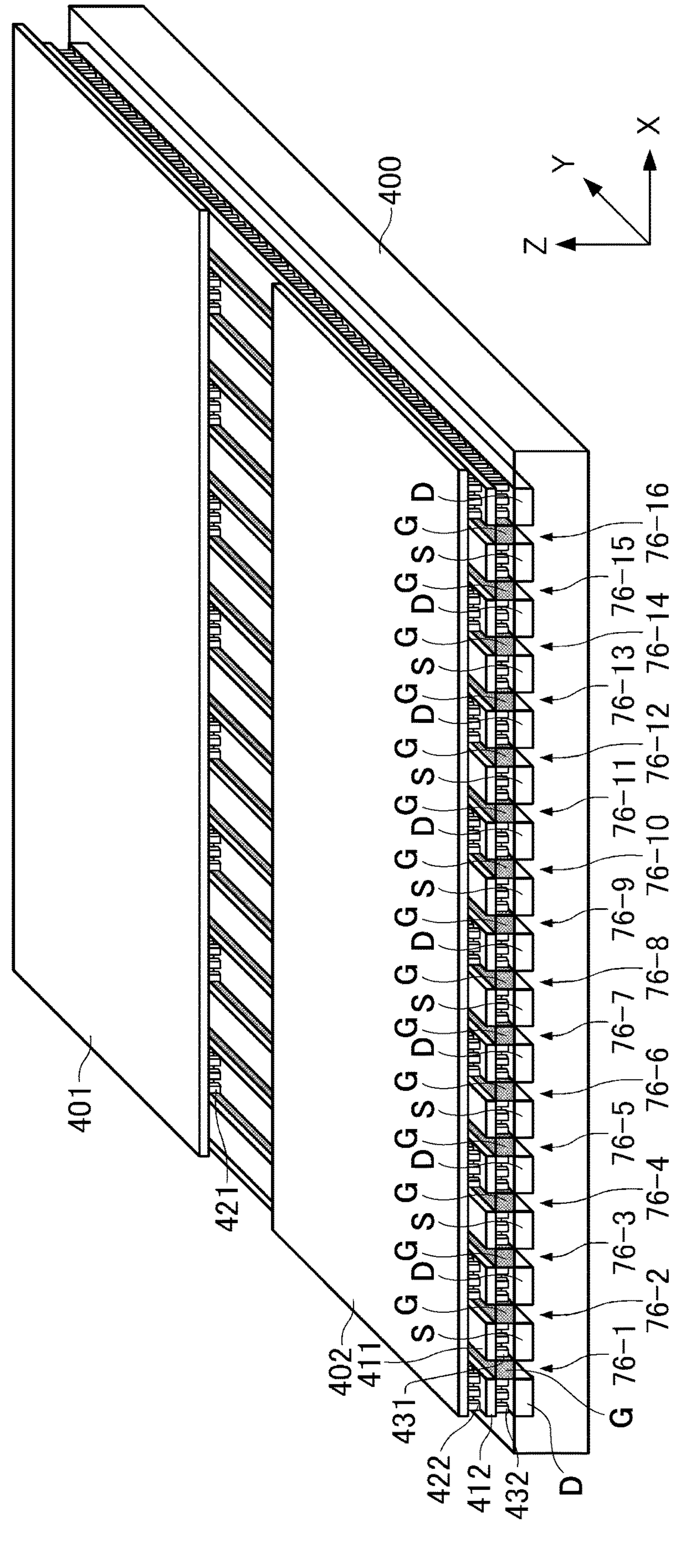
FIG. 8 is a perspective view of a region of an integrated circuit apparatus according to the second embodiment.

Since a plan view illustrating an example of the layout of the integrated circuit apparatus 7 according to the second embodiment is similar to FIG. 3, an illustration and description of the example of the layout of the integrated circuit apparatus 7 according to the second embodiment are omitted. FIG. 7 is a diagram illustrating a detailed layout of the heat generator 71 according to the second embodiment. FIG. 7 also illustrates the pads 401 and 402 using broken lines. FIG. 8 is a perspective view of a region A1 of the integrated circuit apparatus 7 as illustrated in FIG. 3. In FIGS. 3, 7, and 8, X, Y, and Z directions that are three directions perpendicular to each other are illustrated in order to determine a viewing direction. FIGS. 7 and 8 illustrate a case where the integer N illustrated in FIG. 6 is 16, that is, a case where the heat generator 71 includes 16 transistors 76-1 to 76-16.

As illustrated in FIGS. 3 and 7, in a second direction intersecting a first direction that is a longitudinal direction of each of the gate G, the drain D, and the source S of the transistor 76-1, one of the pads 401 and 402 and a pad 404 are arranged side by side. In the second direction, the other of the pads 401 and 402 and a pad 403 are arranged side by side. In FIG. 3, the first direction is the Y direction, the second direction is the X direction, the pad 401 and the pad 404 are arranged side by side in the second direction, and the pad 402 and the pad 403 are arranged side by side in the second direction. However, in the second direction, the pad 402 and the pad 404 may be arranged side by side and the pad 401 and the pad 403 may be arranged side by side.

As illustrated in FIGS. 3 and 7, in the second direction, the temperature sensor 72, the pad 404, and the transistors 76-1 to 76-16 included in the heat generator 71 are arranged side by side in the order of the temperature sensor 72, the pad 404, and the transistors 76-1 to 76-16.

As illustrated in FIGS. 3 and 7, the transistors 76-1 to 76-16 included in the heat generator 71 are located closer to a second side E2 than to a first side E1.

As illustrated in FIGS. 7 and 8, the pad 401 and the pad 402 are arranged side by side in the first direction that is the longitudinal direction of each of the gate G, the drain D, and the source S of the transistor 76-1. For example, the first direction may be the Y direction. In addition, as illustrated in FIG. 7, the transistors 76-1 to 76-16 are arranged side by side in the second direction intersecting the first direction. For example, the second direction may be the X direction.

As illustrated in FIG. 8, in the region A1, the transistors 76-1 to 76-16 are formed on a semiconductor substrate 400. The gates G of the transistors 76-1 to 76-16 are formed in a polysilicon layer, and the drains D and the sources S of the transistors 76-1 to 76-16 are formed in the P+ diffusion layer. The gates G of the transistors 76-1 to 76-16 are electrically coupled to each other via polysilicon wires or metal wires not illustrated.

As illustrated in FIGS. 7 and 8, the source S of the transistor 76-1 and the source S of the transistor 76-2 are formed in the same region. Similarly, the source S of the transistor 76-3 and the source S of the transistor 76-4 are formed in the same region. Similarly, the source S of the transistor 76-5 and the source S of the transistor 76-6 are formed in the same region. Similarly, the source S of the transistor 76-7 and the source S of the transistor 76-8 are formed in the same region. Similarly, the source S of the transistor 76-9 and the source S of the transistor 76-10 are formed in the same region. Similarly, the source S of the transistor 76-11 and the source S of the transistor 76-12 are formed in the same region. Similarly, the source S of the transistor 76-13 and the source S of the transistor 76-14 are formed in the same region. Similarly, the source S of the transistor 76-15 and the source S of the transistor 76-16 are formed in the same region.

In addition, the drain D of the transistor 76-2 and the D drain of the transistor 76-3 are formed in the same region. Similarly, the drain D of the transistor 76-4 and the drain D of the transistor 76-5 are formed in the same region. Similarly, the drain D of the transistor 76-6 and the drain D of the transistor 76-7 are formed in the same region. Similarly, the drain D of the transistor 76-8 and the drain D of the transistor 76-9 are formed in the same region. Similarly, the drain D of the transistor 76-10 and the drain D of the transistor 76-11 are formed in the same region. Similarly, the drain D of the transistor 76-12 and the drain D of the transistor 76-13 are formed in the same region. Similarly, the drain D of the transistor 76-14 and the drain D of the transistor 76-15 are formed in the same region.

As illustrated in FIG. 7, in plan view of the integrated circuit apparatus 7, the drain D of the transistor 76-1 overlaps the pad 402, and the source S of the transistor 76-1 overlaps the pad 401. Specifically, in plan view of the integrated circuit apparatus 7, the gate G, the drain D, and the source S of the transistor 76-1 overlap the pad 402 and the pad 401. In plan view of the integrated circuit apparatus 7, in a region in which the pad 402 overlaps the drain D of the transistor 76-1, a plurality of via wires 422 electrically coupling the pad 402 to the drain D of the transistor 76-1 are formed. In addition, in plan view of the integrated circuit apparatus 7, in a region in which the pad 401 overlaps the source S of the transistor 76-1, a plurality of via wires 421 electrically coupling the pad 401 to the source S of the transistor 76-1 are formed.

Similarly, for each integer i greater than or equal to 2 and less than or equal to 16, in plan view, the drain D of the transistor 76-*i* overlaps the pad 402, and the source S of the transistor 76-*i* overlaps the pad 401. Specifically, in plan view of the integrated circuit apparatus 7, the gate G, the drain D, and the source S of the transistor 76-*i* overlap the pad 402 and the pad 401. In plan view of the integrated circuit apparatus 7, in a region in which the pad 402 overlaps the drain D of the transistor 76-*i*, a plurality of via wires 422 electrically coupling the pad 402 to the drain D of the transistor 76-*i* are formed. In addition, in plan view of the integrated circuit apparatus 7, in a region in which the pad 401 overlaps the source S of the transistor 76-*i*, a plurality of via wires 421 electrically coupling the pad 401 to the source S of the transistor 76-*i* are formed.

As illustrated in FIG. 8, for example, in plan view, each metal wire 411 in the second wiring layer is formed so as to overlap each of the sources S of the transistors 76-1 to 76-16. For each integer i greater than or equal to 1 and less than or equal to N, a plurality of via wires 431 are formed to couple the source S of the transistor 76-*i* to the metal wire 411, and a plurality of via wires 421 are formed to couple the metal wire 411 to the pad 401. Therefore, in plan view of the integrated circuit apparatus 7, in a region in which the pad 401 overlaps the source S of the transistor 76-*i*, the plurality of via wires 421 and some of the plurality of via wires 431 are formed.

In addition, as illustrated in FIG. 8, the pads 401 and 402 are formed by metal wires in a third wiring layer that is the uppermost layer. For example, in plan view, each metal wire 412 in the second wiring layer is formed so as to overlap each of the drains D of the transistors 76-1 to 76-16. For each integer i greater than or equal to 1 and less than or equal to 16, a plurality of via wires 432 are formed to couple the drain D of the transistor 76-*i* to the metal wire 412, and a plurality of via wires 422 are formed to couple the metal wire 412 to the pad 402. Therefore, in plan view of the integrated circuit apparatus 7, in a region in which the pad 402 overlaps the drain D of the transistor 76-*i*, the plurality of via wires 422 and some of the plurality of via wires 432 are formed.

In the integrated circuit apparatus 7 configured as illustrated in FIGS. 3, 7, and 8, current flows from the pad 401 to each of the sources S of the transistors 76-1 to 76-16 through a wiring path formed by the plurality of via wires 421, the metal wire 411, and the plurality of via wires 431. Since the wiring path through which the current flows is very short, parasitic resistance of the wiring path is very small. In addition, since the current flows from each of the sources S of the transistors 76-1 to 76-16 to each of the drains D of the transistors 76-1 to 76-16 in a lateral direction of each of the drains D and the sources S, parasitic resistance of each of the sources S of the transistors 76-1 to 76-16 and parasitic resistance of each of the drains D of the transistors 76-1 to 76-16 are small. Furthermore, the current flows from each of the drains D of the transistors 76-1 to 76-16 to the pad 402 through a wiring path formed by the plurality of via wires 432, the metal wire 412, and the plurality of via wire 422. Since the wiring path through which the current flows is very short, parasitic resistance of the wiring path is very small. Therefore, since the parasitic resistance RS-1 to RS-16 and the parasitic resistance RD-1 to RD-16 illustrated in FIG. 6 are reduced, the current that flows in the transistors 76-1 to 76-16 increases and the heat generation efficiency of the heat generator 71 is improved.

In the second embodiment, the pad 402 is an example of the "first pad", the pad 401 is an example of the "second pad", and the pad 404 is an example of the "third pad". In the second embodiment, the transistor 76-1 is an example of the "first transistor", the gate G, the drain D, and the source S of the transistor 76-1 are an example of the "first gate", an example of the "first drain", and an example of the "first source", respectively. In the second embodiment, the transistors 76-1 to 76-N are an example of the "second to Nth transistors". In the second embodiment, for each integer i greater than or equal to 2 and less than or equal to N, the gate G, the drain D, and the source S of the transistor 76-*i* are an example of the "ith gate", an example of the "ith drain", and an example of the "ith source", respectively. In addition, each of the plurality of via wires 422 electrically coupling the pad 402 to the drain D of the transistor 76-1 is an example of the "first drain coupling via wire", and each of the plurality of via wires 421 electrically coupling the pad 401 to the source S of the transistor 76-1 is an example of the "first source coupling via wire". Furthermore, for each integer i greater than or equal to 2 and less than or equal to N, each of the plurality of via wires 422 electrically coupling the pad 402 to the drain D of the transistor 76-*i* is an example of the "ith drain coupling via wire", and each of the plurality of via wires 421 electrically coupling the pad 401 to the source S of the transistor 76-*i* is an example of the "ith source coupling via wire".

As described above, according to the integrated circuit apparatus 7 according to the second embodiment, current flows from the pad 401 to the sources S of the transistors 76-1 to 76-N through the plurality of via wires 421, the plurality of metal wires 411, and the plurality of via wires 431 in very short paths. The current flows from the sources S of the transistors 76-1 to 76-N to the drains D of the transistors 76-1 to 76-N through short paths and further flows from the drains D of the transistors 76-1 to 76-N to the pad 402 through the plurality of via wires 432, the plurality of metal wires 412, and the plurality of via wires 422 in very short paths. Therefore, paths through which the current flows from the pad 401 to the pad 402 are short. In addition, the current flows in a direction orthogonal to the pads 401 and 402 between the pads 401 and 402 and the transistors 76-1 to 76-N, and thus the cross-sectional areas of the wires through which the current flows are large. Therefore, according to the integrated circuit apparatus 7 according to the second embodiment, parasitic resistance between the pads 401 and 402 and the transistors 76-1 to 76-N is small and it is possible to reduce the possibility that the current that flows in the transistors 76-1 to 76-N may decrease due to the parasitic resistance.

Furthermore, according to the integrated circuit apparatus 7 according to the second embodiment, the cross-sectional areas of the wires through which the current flows between the pads 401 and 402 and the transistors 76-1 to 76-N are large. Therefore, the integrated circuit apparatus 7 according to the second embodiment is resistant to electromigration.

In addition, according to the integrated circuit apparatus 7 according to the second embodiment, in plan view, in regions in which the sources S and the drains D of the transistors 76-1 to 76-N overlap the pads 401 and 402, the transistors 76-1 to 76-N including the sources S and the drains D having large areas can be disposed. Thus, it is possible to increase the current that flows in the transistors 76-1 to 76-N. Therefore, it is possible to implement the integrated circuit apparatus 7 that is small in size and in which a sufficient amount of current can flow.

In addition, according to the integrated circuit apparatus 7 according to the second embodiment, the pads 401 and 402 are arranged side by side in the first direction that is the longitudinal direction of the gate G of the transistor 76-1, and the pads 401 and 402 are arranged side by side with the pads 404 and 403 in the second direction intersecting the first direction. Therefore, a dead space does not occur between the pads 401 and 404 and the third side E3 and between the pads 402 and 403 and the fourth side E4 and it is possible to easily bond the pads 401, 402, 403, and 404.

In the integrated circuit apparatus 7 according to the second embodiment, the temperature sensor is located close to the first side E1, and the transistors 76-1 to 76-N are located close to the second side E2. In the integrated circuit apparatus 7 according to the second embodiment, in the second direction, the temperature sensor 72, the pad 404, the electrostatic protection circuit 73, and the transistors 76-1 to 76-N are arranged side by side in the order of the temperature sensor 72, the pad 404, the electrostatic protection circuit 73, and the transistors 76-1 to 76-N. That is, the temperature sensor 72 is located away from the transistors 76-1 to 76-N and thus it is possible to prevent the temperature to be detected by the temperature sensor 72 from rapidly changing due to a change in the amount of heat generated by the transistors 76-1 to 76-N.

2. Oscillator

2-1. Structure of Oscillator

Figure 9:
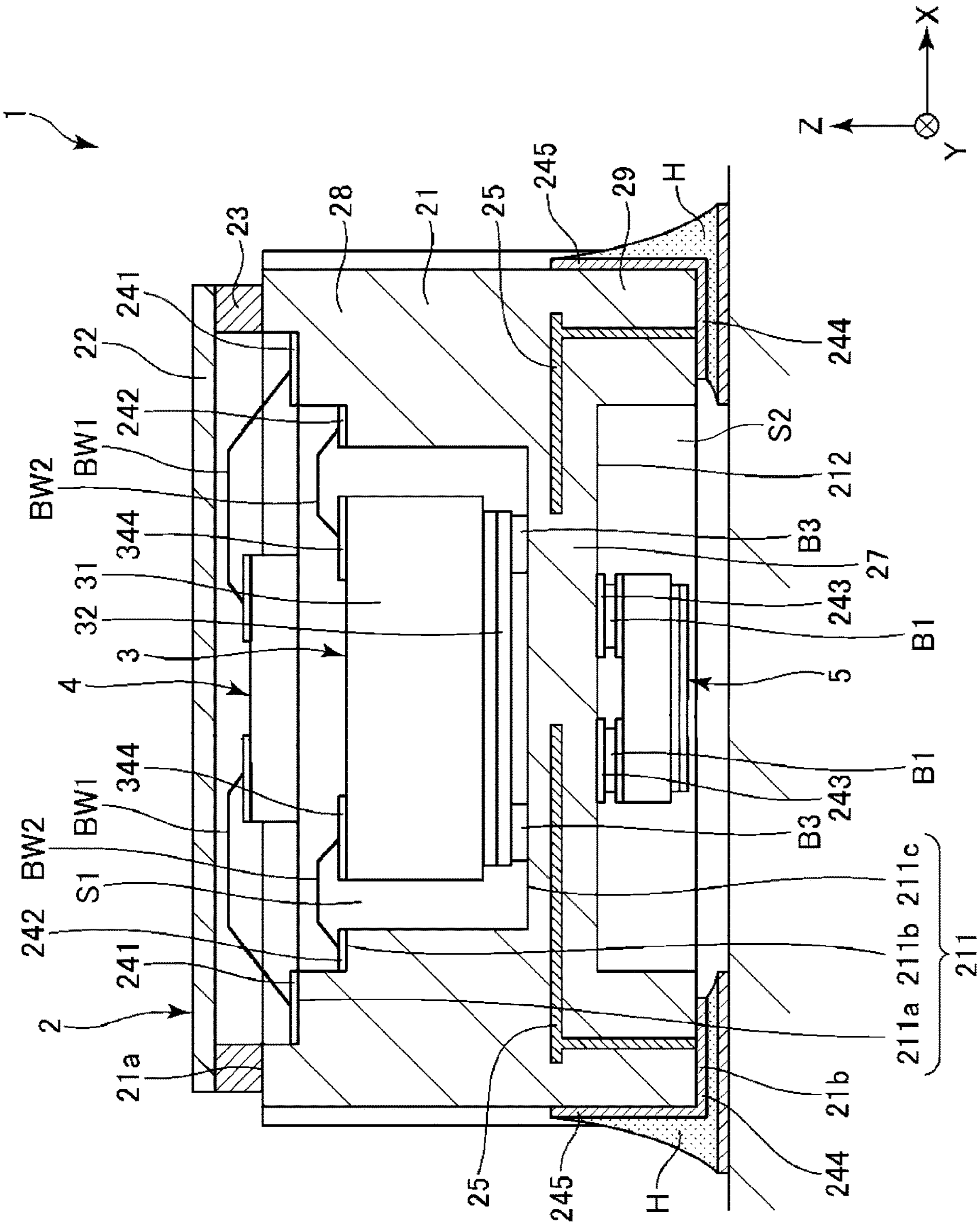
FIG. 9 is a cross-sectional view of an oscillator according to one embodiment.
Figure 10:
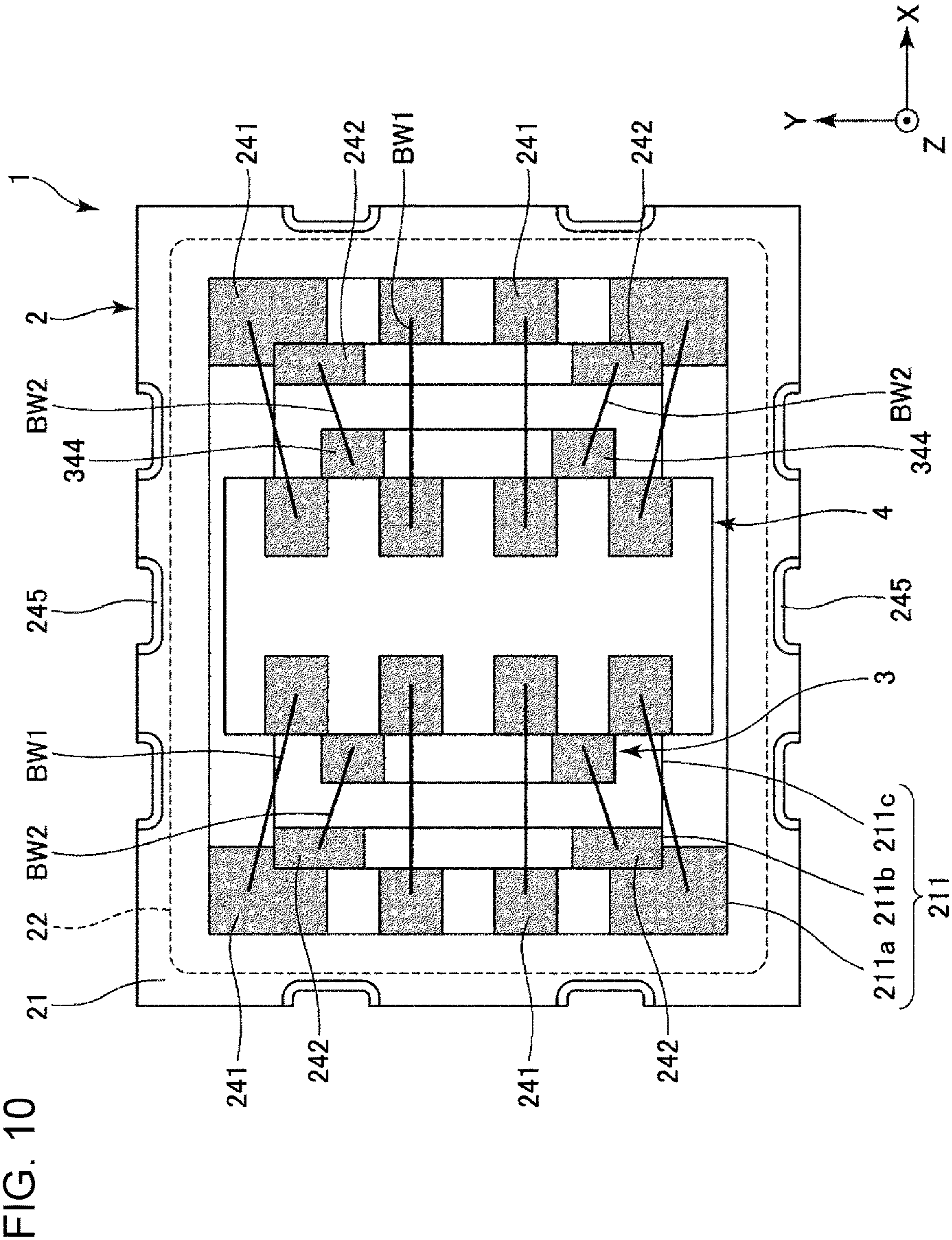
FIG. 10 is a plan view of the oscillator according to the embodiment.
Figure 11:
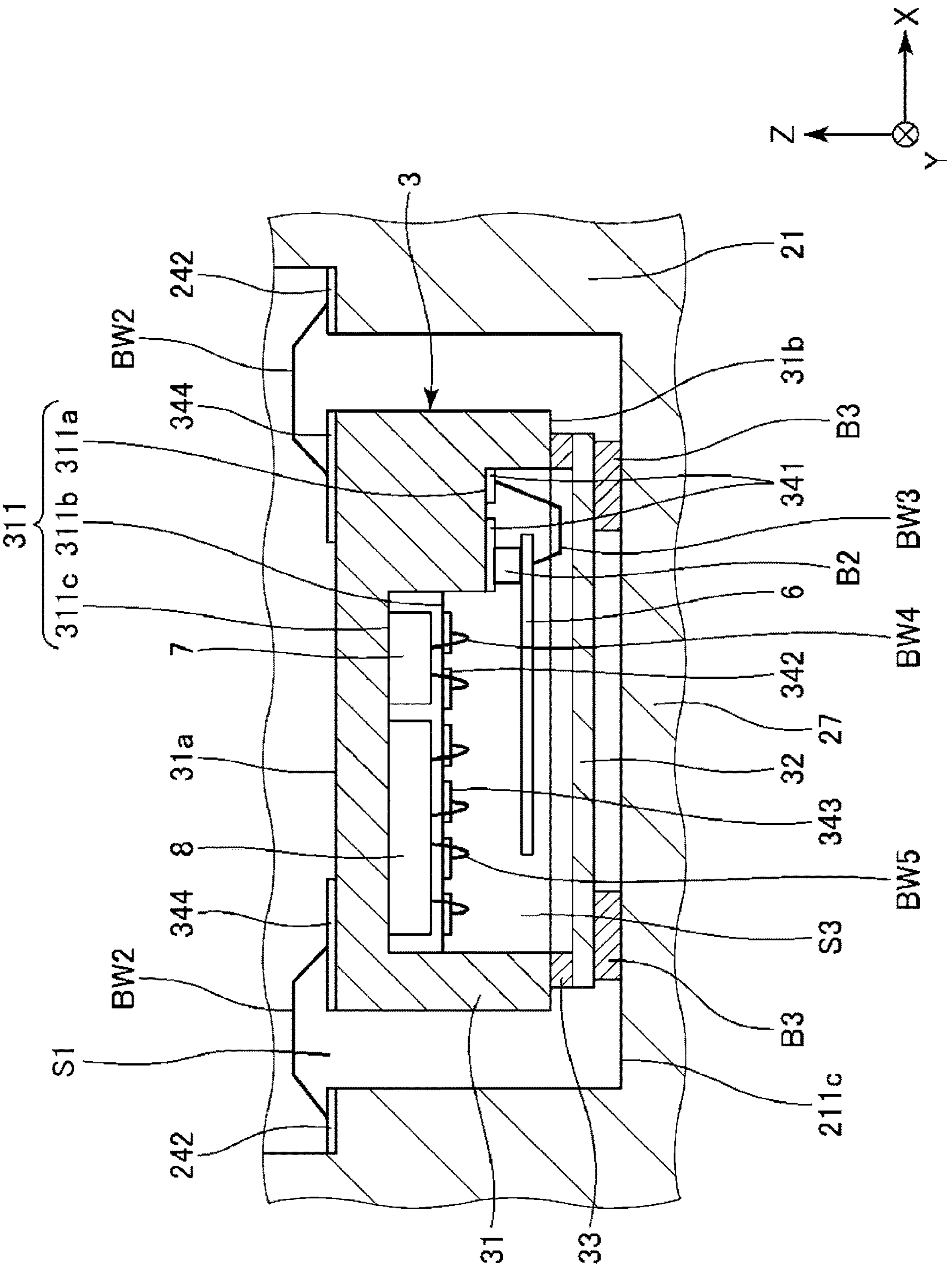
FIG. 11 is a cross-sectional view illustrating an inner package included in the oscillator and the inside of the inner package.
Figure 12:
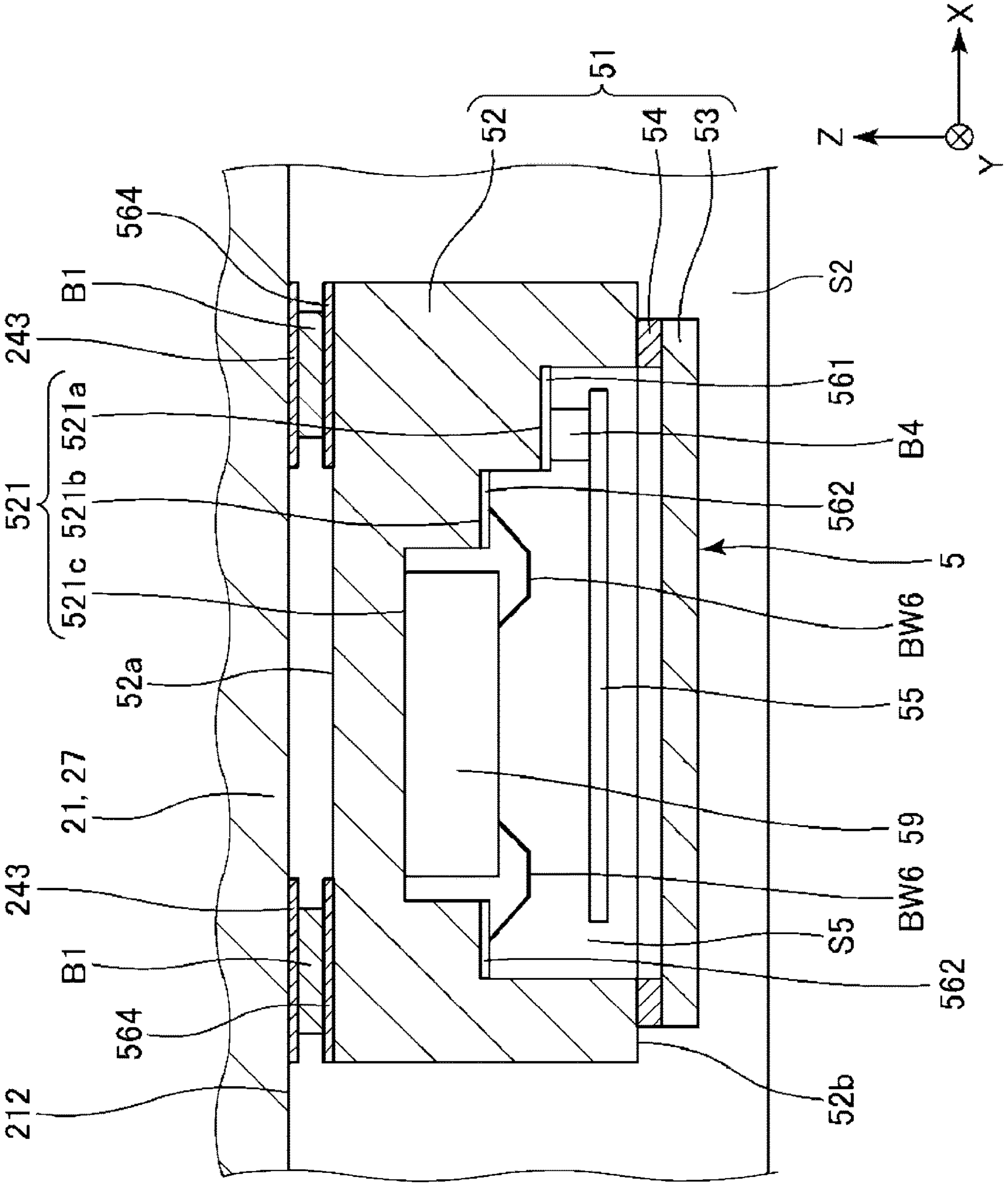
FIG. 12 is a cross-sectional view illustrating a voltage controlled oscillator included in the oscillator.

FIG. 9 is a cross-sectional view illustrating an oscillator according to one embodiment. FIG. 10 is a plan view of the oscillator viewed from above. FIG. 11 is a cross-sectional view illustrating an inner package included in the oscillator and the inside of the inner package. FIG. 12 is a cross-sectional view illustrating a voltage controlled oscillator included in the oscillator.

The oscillator 1 illustrated in FIGS. 9 and 10 is an oven-controlled crystal oscillator and includes an outer package 2, the inner package 3, a control IC 4, and the voltage controlled oscillator 5. The inner package 3, the control IC 4, and the voltage controlled oscillator 5 are housed in the outer package 2.

As illustrated in FIG. 9, the outer package 2 includes an outer base 21 and an outer lid 22. The outer base 21 includes a substrate 27, a frame-shaped wall portion 28 erected upward from an edge portion of an upper surface of the substrate 27, and a frame-shaped leg portion 29 erected downward from an edge portion of a lower surface of the substrate 27. The upper surface of the substrate 27 and the wall portion 28 form an upper recess 211 that is open to an upper surface 21*a* of the outer base 21 and serves as a housing space S1. The lower surface of the substrate 27 and the leg portion 29 form a lower recess 212 that is open to a lower surface 21*b* of the outer base 21 and serves as a housing space S2. Therefore, the outer base 21 has a substantially H shape in cross-sectional view.

The upper recess 211 includes a first upper recess 211*a* that is open to the upper surface 21*a*, a second upper recess 211*b* that is open to a bottom surface of the first upper recess 211*a* and has an opening smaller than that of the first upper recess 211*a*, and a third upper recess 211*c* that is open to a bottom surface of the second upper recess 211*b* and has an opening smaller than that of the second upper recess 211*b*. The control IC 4 is disposed on the bottom surface of the first upper recess 211*a*. The inner package 3 is disposed on a bottom surface of the third upper recess 211*c*.

The outer lid 22 is bonded to the upper surface 21*a* of the outer base 21 via a sealing material 23 such as a sealing ring or low-melting-point glass to close the opening of the upper recess 211. Therefore, the upper recess 211 serving as the housing space S1 is hermetically sealed. The integrated circuit apparatus 7, a resonator element 6, and an oscillation IC 8 are housed in the housing space S1. The integrated circuit apparatus 7 serves as a heat generating IC. The control IC 4 is also housed in the housing space S1. Specifically, as described later, the integrated circuit apparatus 7, the resonator element 6, and the oscillation IC 8 are housed in the inner package 3, while the inner package 3 and the control IC 4 are housed in the housing space S1. The opening of the lower recess 212 serving as the housing space S2 is not sealed and the lower recess 212 is open to the outside of the outer package 2. The voltage controlled oscillator 5 is housed in the housing space S2.

A plurality of internal terminals 241, a plurality of internal terminals 242, a plurality of internal terminals 243, and a plurality of external terminals 244 are disposed on the outer base 21. The plurality of internal terminals 241 are disposed on the bottom surface of the first upper recess 211*a*. The plurality of internal terminals 242 are disposed on the bottom surface of the second upper recess 211*b*. The plurality of internal terminals 243 are disposed on a bottom surface of the lower recess 212. The plurality of external terminals 244 are disposed on the lower surface 21*b*, that is, on a top surface of the leg portion 29. Each of the internal terminals 241 is electrically coupled to the control IC 4 via a bonding wire BW1. Each of the internal terminals 242 is electrically coupled to the inner package 3 via a bonding wire BW2. Each of the internal terminals 243 is electrically coupled to the voltage controlled oscillator 5 via a conductive bonding member B1.

The terminals 241, 242, 243, and 244 are appropriately electrically coupled to each other via internal wires 25 formed in the outer base 21 and electrically couple the control IC 4, the inner package 3, the voltage controlled oscillator 5, and the external terminals 244 to each other. The internal wires 25 are coupled to the external terminals 244 through the inside of the leg portion 29. The external terminals 244 are coupled to an external apparatus not illustrated. Side surface terminals 245 are disposed on a side surface of the leg portion 29 and coupled to the external terminals 244. The side surface terminals 245 are castellations. Therefore, solder H spreads on the side surface terminals 245 to form fillets, resulting in stronger mechanical and electrical bonding to the external apparatus. However, the structure is not limited thereto and, for example, the side surface terminals 245 may be omitted.

As illustrated in FIG. 11, the inner package 3 includes an inner base 31 and an inner lid 32. The inner base 31 includes a recess 311 that is open to a lower surface 31*b* of the inner base 31.

The recess 311 includes a first recess 311*a* that is open to the lower surface 31*b*, a second recess 311*b* that is open to a bottom surface of the first recess 311*a* and has an opening smaller than that of the first recess 311*a*, and a third recess 311*c* that is open to a bottom surface of the second recess 311*b* and has an opening smaller than that of the second recess 311*b*. The resonator element 6 is disposed on the bottom surface of the first recess 311*a*. The integrated circuit apparatus 7 and the oscillation IC 8 are arranged side by side in the X direction on a bottom surface of the third recess 311*c*.

The inner lid 32 is bonded to the lower surface 31*b* of the inner base 31 via a sealing member 33 such as a sealing ring or low-melting-point glass to close the opening of the recess 311. Therefore, the recess 311 is hermetically sealed and a housing space S3 is formed in the inner package 3. The resonator element 6, the integrated circuit apparatus 7, and the oscillation IC 8 are housed in the housing space S3.

The housing space S3 is airtight and is in a reduced pressure state, preferably in a state close to vacuum. This reduces the viscous resistance of the housing space S3 and improves the resonance characteristics of the resonator element 6. However, the atmosphere in the housing space S3 is not particularly limited.

A plurality of internal terminals 341, a plurality of internal terminals 342 and 343, and a plurality of external terminals 344 are disposed on the inner base 31. The plurality of internal terminals 341 are disposed on the bottom surface of the first recess 311*a*. The plurality of internal terminals 342 and 343 are disposed on the bottom surface of the second recess 311*b*. The plurality of external terminals 344 are disposed on an upper surface 31*a* of the inner base 31. Each of the internal terminals 341 is electrically coupled to the resonator element 6 via a conductive bonding member B2 and a bonding wire BW3. Each of the internal terminals 342 is electrically coupled to the integrated circuit apparatus 7 via a bonding wire BW4. Each of the internal terminals 343 is electrically coupled to the oscillation IC 8 via a bonding wire BW5.

The terminals 341, 342, 343, and 344 are appropriately electrically coupled to each other via internal wires (not illustrated) formed in the inner package 3 and electrically couple the resonator element 6, the integrated circuit apparatus 7, the oscillation IC 8, and the external terminals 344 to each other. The inside and the outside of the inner package 3 are electrically coupled to each other via the external terminals 344.

The inner package 3 described above is fixed to the bottom surface of the third upper recess 211*c* via a bonding member B3 with sufficiently low thermal conductivity at the inner lid 32.

As illustrated in FIG. 11, the integrated circuit apparatus 7 is disposed on the bottom surface of the third recess 311*c* such that an active surface of the integrated circuit apparatus 7 faces the lower side (the inner lid 32 side), and is electrically coupled to each of the internal terminals 342 via the bonding wire BW4. The oscillation IC 8 is disposed on the bottom surface of the third recess 311*c* such that an active surface of the oscillation IC 8 faces the lower side (the inner lid 32 side), and is electrically coupled to each of the internal terminals 343 via the bonding wire BW5.

The voltage controlled oscillator 5 is an oscillator that outputs an oscillation signal whose frequency changes according to an input voltage. As illustrated in FIG. 12, the voltage controlled oscillator 5 includes a package 51, a resonator element 55, and an oscillation IC 59. The resonator element 55 and the oscillation IC 59 are housed in the package 51.

The package 51 includes a base 52 and a lid 53. The base 52 includes a recess 521 that is open to a lower surface 52*b* of the base 52. The recess 521 includes a first recess 521*a* that is open to the lower surface 52*b*, a second recess 521*b* that is open to a bottom surface of the first recess 521*a* and has an opening smaller than that of the first recess 521*a*, and a third recess 521*c* that is open to a bottom surface of the second recess 521*b* and has an opening smaller than that of the second recess 521*b*. The resonator element 55 is disposed on the bottom surface of the first recess 521*a*. The oscillation IC 59 is disposed on a bottom surface of the third recess 521*c*.

The lid 53 is bonded to the lower surface 52*b* of the base 52 via a sealing member 54 such as a sealing ring or low-melting-point glass to close the opening of the recess 521. Therefore, the recess 521 is hermetically sealed and a housing space S5 is formed in the package 51. The resonator element 55 and the oscillation IC 59 are housed in the housing space S5. The housing space S5 is airtight and is in a reduced pressure state, preferably in a state close to vacuum. This reduces the viscous resistance of the housing space S5 and improves the resonance characteristics of the resonator element 55. However, the atmosphere in the housing space S5 is not particularly limited.

A plurality of internal terminals 561, a plurality of internal terminals 562, and a plurality of external terminals 564 are disposed on the base 52. The plurality of internal terminals 561 are disposed on the bottom surface of the first recess 521*a*. The plurality of internal terminals 562 are disposed on the bottom surface of the second recess 521*b*. The plurality of external terminals 564 are disposed on an upper surface 52*a* of the base 52. Each of the internal terminals 561 is electrically coupled to the resonator element 55 via a conductive bonding member B4. Each of the internal terminals 562 is electrically coupled to the oscillation IC 59 via a bonding wire BW6. The terminals 561, 562, and 564 are appropriately electrically coupled to each other via internal wires (not illustrated) formed in the base 52 and electrically couple the resonator element 55, the oscillation IC 59, and the external terminals 564 to each other. The inside and the outside of the package 51 are electrically coupled to each other via the external terminals 564.

The resonator element 55 is an AT-cut crystal resonator element. However, the resonator element 55 may not be the AT-cut crystal resonator element and may be, for example, an SC-cut crystal resonator element, a BT-cut crystal resonator element, a tuning fork crystal resonator element, a surface acoustic wave resonator, another piezoelectric resonator element, a MEMS resonant element, or the like.

The oscillation IC 59 is disposed on the bottom surface of the third recess 521*c* such that an active surface of the oscillation IC 59 faces the lower side, and is electrically coupled to each of the internal terminals 562 via a bonding wire BW6.

As illustrated in FIG. 12, the voltage controlled oscillator 5 is fixed to the bottom surface of the lower recess 212 via the conductive bonding member B1. In addition, the external terminals 564 are electrically coupled to the internal terminals 243 via the conductive bonding member B1.

The outer package 2 is an example of a "first container". The inner package 3 is an example of a "second container". The upper surface of the substrate 27 is an example of a "first surface". The lower surface of the substrate 27 is an example of a "second surface". The housing space S1 is an example of a "first housing space". The housing space S2 is an example of a "second housing space".

2-2. Functional Configuration of Oscillator

Figure 13:
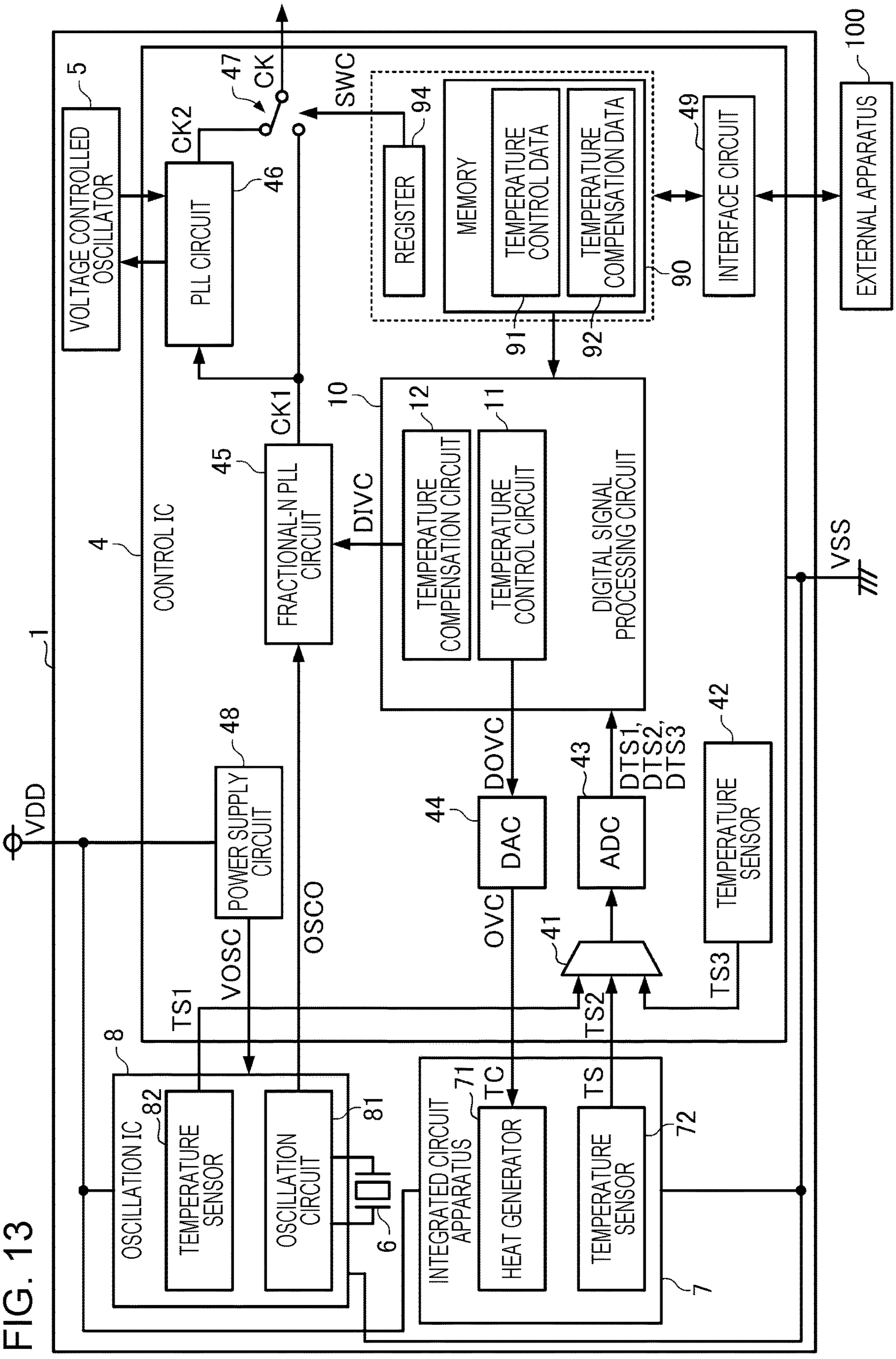
FIG. 13 is a functional block diagram of the oscillator.

FIG. 13 is a functional block diagram of the oscillator 1 according to the present embodiment. In FIG. 13, the same components as those illustrated in FIGS. 9 to 12 are denoted by the same reference signs as those illustrated in FIGS. 9 to 12. As illustrated in FIG. 13, the oscillator 1 according to the present embodiment includes the control IC 4, the voltage controlled oscillator 5, the resonator element 6, the integrated circuit apparatus 7 according to the above-described first or second embodiment, and the oscillation IC 8. The integrated circuit apparatus 7 serves as the heat generating IC.

The oscillation IC 8 includes an oscillation circuit 81 and a temperature sensor 82 and operates when a power supply voltage VOSC is supplied from the control IC 4 to the oscillation IC 8. The oscillation circuit 81 is electrically coupled to both ends of the resonator element 6. The oscillation circuit 81 amplifies a signal output from the resonator element 6, feeds the amplified signal back to the resonator element 6 to cause the resonator element 6 to oscillate, and outputs an oscillation signal OSCO. For example, the oscillation circuit 81 may use an inverter as an amplifying element or may use a bipolar transistor as an amplifying element. The oscillation signal Osco output from the oscillation circuit 81 is input to the control IC 4.

The temperature sensor 82 is a temperature-sensitive element that detects a temperature and outputs a temperature detection signal TS1 having a voltage level corresponding to the detected temperature. The temperature sensor 82 is included in the oscillation IC 8 and detects the temperature of the oscillation IC 8. The temperature detection signal TS1 output from the temperature sensor 82 is input to the control IC 4. For example, the temperature sensor 82 may be a sensor that uses temperature dependence of a forward voltage of a PN junction of a diode.

As described above, the integrated circuit apparatus 7 includes the heat generator 71 and the temperature sensor 72. A temperature control signal OVC output from the control IC 4 is input to the heat generator 71 as the above-described temperature control signal TC. The amount of heat generated by the heat generator 71 changes according to the voltage level of the temperature control signal OVC. As the amount of heat generated by the heat generator 71 increases, the temperature of the resonator element 6 increases. That is, the temperature of the resonator element 6 is controlled by the integrated circuit apparatus 7. Actually, the control IC 4 controls the amount of heat to be generated by the heat generator 71 such that the temperature of the resonator element 6 is maintained at a set temperature that is a target fixed temperature. For example, the set temperature may be a fixed value of 80° C. or may be set to be in a predetermined range such as a range from 70° C. to 125° C.

As described above, the temperature sensor 72 detects the temperature of the heat generator 71 and outputs a temperature detection signal TS having a voltage level corresponding to the detected temperature. The temperature detection signal TS is input to the control IC 4 as a temperature detection signal TS2.

As illustrated in FIG. 11, the resonator element 6, the integrated circuit apparatus 7, and the oscillation IC 8 are housed in the inner package 3. The control IC 4 controls the heat generation of the integrated circuit apparatus 7 such that the temperature of the resonator element 6 is maintained at a fixed temperature. Since the integrated circuit apparatus 7 is a heat generation source and heat released from the integrated circuit apparatus 7 is transferred to the resonator element 6 and the oscillation IC 8, the temperature of the resonator element 6 and the temperature of the oscillation IC 8 may differ from the temperature of the integrated circuit apparatus 7. However, the resonator element 6 and the oscillation IC 8 are separated from the integrated circuit apparatus 7. When a thermal distance between the integrated circuit apparatus 7 and the resonator element 6 is regarded as being nearly equal to a thermal distance between the integrated circuit apparatus 7 and the oscillation IC 8, it can be said that the temperature of the oscillation IC 8 is close to the temperature of the resonator element 6. That is, the temperature detected by the temperature sensor 82 included in the oscillation IC 8 is closer to the temperature of the resonator element 6 than the temperature detected by the temperature sensor 72 included in the integrated circuit apparatus 7 is. Therefore, the control IC 4 controls the heat generation of the integrated circuit apparatus 7 based on the temperature detection signal TS1 output from the temperature sensor 82. However, the temperature of the integrated circuit apparatus 7 may be closer to the temperature of the resonator element 6 than the temperature of the oscillation IC 8 is, depending on the arrangement of the resonator element 6, the integrated circuit apparatus 7, and the oscillation IC 8. In this case, the control IC 4 may control the heat generation of the integrated circuit apparatus 7 based on the temperature detection signal TS2 output from the temperature sensor 72.

The control IC 4 includes a digital signal processing circuit 10, a selector 41, a temperature sensor 42, an A/D converter 43, a D/A converter 44, a fractional-N phase locked loop (PLL) circuit 45, a PLL circuit 46, a switching circuit 47, a power supply circuit 48, an interface circuit 49, a memory 90, and a register 94.

The power supply circuit 48 generates the power supply voltage VOSC based on the power supply voltage VDD and the ground voltage VSS supplied from outside the oscillator 1. The power supply voltage VOSC is a fixed voltage lower than the power supply voltage VDD. For example, the power supply circuit 48 generates, based on a voltage output from a band gap reference circuit, the power supply voltage VOSC that is a fixed voltage. The power supply voltage VOSC is supplied to the oscillation IC 8.

The oscillation signal OSCO output from the oscillation IC 8 is input to the fractional-N PLL circuit 45. The fractional-N PLL circuit 45 outputs a clock signal CK1 obtained by converting a frequency $f_{OSCO}$ of the oscillation signal OSCO into a frequency $f_{CK1}$ according to a division ratio indicated by a division ratio control signal DIVC. The fractional-N PLL circuit 45 generates the clock signal CK1 by performing feedback control such that the phase of the oscillation signal OSCO matches the phase of a signal obtained by dividing the frequency of the clock signal CK1 according to the division ratio indicated by the division ratio control signal DIVC. The division ratio control signal DIVC is delta-sigma modulated and the division ratio indicated by the division ratio control signal DIVC is switched between a plurality of integer division ratios. When the plurality of integer division ratios are averaged, the average of the integer division ratios is a fractional division ratio. Therefore, the frequency $f_{CK1}$ is a non-integer multiple of the frequency $f_{OSCO}$. The fractional-N PLL circuit 45 may output, based on the division ratio control signal DIVC, the clock signal CK1 with the frequency $f_{CK1}$ that is different from the frequency $f_{OSCO}$ and is an almost fixed value regardless of the temperature of air outside the oscillator 1.

The clock signal CK1 output from the fractional-N PLL circuit 45 is input to the PLL circuit 46. The PLL circuit 46 outputs a clock signal CK2 with a frequency $f_{CK2}$ equal to the frequency $f_{CK1}$ of the clock signal CK1. The PLL circuit 46 generates the clock signal CK2 by performing feedback control on a voltage input to the voltage controlled oscillator 5 such that the phase of the clock signal CK1 matches the phase of the clock signal CK2 to be output from the voltage controlled oscillator 5.

The frequency $f_{CK1}$ of the clock signal CK1 output from the fractional-N PLL circuit 45 is a non-integer multiple of the frequency $f_{OSCO}$ of the oscillation signal OSCO and has large jitter. Meanwhile, the frequency $f_{CK2}$ of the clock signal CK2 output from the PLL circuit 46 is equal to the frequency $f_{CK1}$ of the clock signal CK1, and the clock signal CK2 is output from the voltage controlled oscillator 5 including the resonator element 55 with high frequency stability. Therefore, the clock CK2 has jitter smaller than that of the clock signal CK1.

The switching circuit 47 selects either the clock signal CK1 or the clock signal CK2 based on a logic level of a switch control signal SWC output from the register 94 and outputs the selected clock signal CK1 or CK2. The selected clock signal CK1 or CK2 may be referred to as a clock signal CK. The clock signal CK is output to the outside of the oscillator 1. The clock signal CK may be supplied to an external apparatus 100 and may be supplied to an apparatus different from the external apparatus 100. For example, in a normal operation of the oscillator 1, the clock signal CK2 with smaller jitter may be selected as the clock signal CK. In inspection of the clock signal CK1, the clock signal CK1 may be selected as the clock signal CK.

The temperature sensor 42 is a temperature-sensitive element that detects a temperature and outputs a temperature detection signal TS3 having a voltage level corresponding to the detected temperature. The temperature sensor 42 is included in the control IC 4 and detects the temperature of the control IC 4. As illustrated in FIG. 9, the control IC 4 is located close to the outer lid 22. The distance between the resonator element 6 and the temperature sensor 42 is longer than the distance between the resonator element 6 and the temperature sensor 82 included in the oscillation IC 8. The temperature of the control IC 4 is easily affected by the temperature of the air outside the oscillator 1. Therefore, when the amount of heat generated by the control IC 4 is an almost fixed value, the temperature sensor 42 can detect a change in the temperature of the air outside the oscillator 1. The temperature detection signal TS2 output from the temperature sensor 72 is input to the control IC 4. For example, the temperature sensor 72 may be a sensor that uses temperature dependence of a forward voltage of a PN junction of a diode.

The selector 41 selects and outputs any one of the temperature detection signal TS1 output from the oscillation IC 8, the temperature detection signal TS2 output from the integrated circuit apparatus 7, and the temperature detection signal TS3 output from the temperature sensor 42. In the present embodiment, the selector 41 selects the temperature detection signals TS1, TS2, and TS3 in a time-division manner and periodically outputs the temperature detection signals TS1, TS2, and TS3.

The A/D converter 43 converts the temperature detection signals TS1, TS2, and TS3 that are analog signals output from the selector 41 in a time-division manner into temperature codes DTS1, DTS2, and DTS3 that are digital signals. The A/D converter 43 may convert the temperature detection signals TS1, TS2, and TS3 into the temperature codes DTS1, DTS2, and DTS3 after converting the voltage levels of the temperature detection signals TS1, TS2, and TS3 by a resistance voltage divider or the like.

The digital signal processing circuit 10 includes a temperature control circuit 11 and a temperature compensation circuit 12.

The temperature control circuit 11 generates a control signal that controls an operation of the heat generator 71 included in the integrated circuit apparatus 7. Specifically, the temperature control circuit 11 outputs a temperature control code DOVC for controlling the amount of heat to be generated by the heat generator 71, based on the temperature code DTS1 or the temperature code DTS2 and temperature control data 91 stored in the nonvolatile memory 90. For example, the temperature control data 91 may include information indicating the set temperature that is the target temperature of the resonator element 6, and information indicating a gain for controlling the amount of heat to be generated by the heat generator 71.

Alternatively, when the set temperature that is the target temperature of the resonator element 6 changes due to the temperature of the air outside the oscillator 1, the temperature control data 91 may include information indicating a relationship between the temperature code DTS3 and the set temperature. In this case, the temperature control circuit 11 outputs the temperature control code DOVC based on the temperature code DTS1 or the temperature codes DTS2 and DTS3 and the temperature control data 91.

The temperature compensation circuit 12 performs temperature compensation on the frequency of the oscillation signal OSCO generated by the oscillation circuit 81 included in the oscillation IC 8 causing the resonator element 6 to oscillate. Specifically, the temperature compensation circuit 12 outputs, to the fractional-N PLL circuit 45, the division ratio control signal DIVC for outputting the clock signal CK1 whose frequency is fixed regardless of the temperature, based on the temperature code DTS3 and temperature compensation data 92 stored in the memory 90. For example, the temperature compensation data 92 may be table information indicating a relationship between the temperature code DTS3 and the frequency of the oscillation signal OSCO or may be information indicating a coefficient value of each order of an expression indicating the relationship. Alternatively, the temperature compensation data 92 may be information indicating a relationship between the temperature code DTS3 and the value of the fractional division ratio of the fractional-N PLL circuit 45. In this case, the relationship between the temperature code DTS3 and the value of the fractional division ratio of the fractional-N PLL circuit 45 is calculated from the relationship between the temperature code DTS3 and the frequency of the oscillation signal OSCO.

The temperature control circuit 11 may be a hardware circuit that performs temperature control processing of controlling the operation of the heat generator 71. Similarly, the temperature compensation circuit 12 may be a hardware circuit that performs temperature compensation processing of performing temperature compensation on the frequency of the oscillation signal OSCO. Alternatively, the digital signal processing circuit 10 may include a central processing unit (CPU) and a nonvolatile memory, and the CPU may perform the temperature control processing of controlling the operation of the heat generator 71 based on a temperature control program stored in the nonvolatile memory. That is, the CPU may function as the temperature control circuit 11 by executing the temperature control program. Similarly, the CPU may perform the temperature compensation processing of performing temperature compensation on the frequency of the oscillation signal OSCO based on a temperature compensation program stored in the nonvolatile memory. That is, the CPU may function as the temperature compensation circuit 12 by executing the temperature compensation program.

The D/A converter 44 converts the temperature control code DOVC that is a digital signal output from the temperature control circuit 11 into the temperature control signal OVC that is an analog signal. The temperature control signal OVC is supplied to the heat generator 71 of the integrated circuit apparatus 7.

The interface circuit 49 is a circuit for communicating data with the external apparatus 100 coupled to the oscillator 1. Specifically, the interface circuit 49 writes and reads data to and from the memory 90 or the register 94 according to a request from the external apparatus 100. The interface circuit 49 may be compliant with an Inter-Integrated Circuit (I2C) bus or may be compliant with a Serial Peripheral Interface (SPI) bus.

In an inspection process in manufacturing of the oscillator 1, the inspection apparatus that is the external apparatus 100 may set a switch control signal SWC for selecting the clock signal CK1 in the switching circuit 47 and inspect the clock signal CK1. In addition, the inspection apparatus that is the external apparatus 100 writes the temperature control data 91 and the temperature compensation data 92 to the memory 90 via the interface circuit 49. The external apparatus 100 may set the temperature control data 91 and the temperature compensation data 92 in the register 94 when the oscillator 1 is started.

According to the above-described oscillator 1 according to the present embodiment, since the integrated circuit apparatus 7 that is small in size and in which a sufficient amount of current can flow in the heat generator 71 is used, the integrated circuit apparatus 7, the resonator element 6, and the oscillation IC 8 can be housed in the inner package 3. Therefore, it is possible to implement the oscillator 1 that is small in size and can accurately control the temperature of the resonator element 6 and output the clock signal CK with the highly accurate frequency.

The present disclosure is not limited to the above-described embodiments, and various modification can be made within the scope of the present disclosure.

The above-described embodiments and the above-described modifications are examples, and the present disclosure is not limited thereto. For example, each of the embodiments and each of the modifications can be combined as appropriate.

The present disclosure includes configurations that are substantially the same as those described in the embodiments, for example, configurations with the same functions, methods, and results as those described in the embodiments, or configurations with the same purposes and effects as those described in the embodiments. In addition, the present disclosure includes a configuration in which a non-essential component in at least one of the configurations described in the embodiments is replaced. Furthermore, the present disclosure includes a configuration in which the same effects as those obtained in the configurations described in the embodiments are obtained, or a configuration in which the same purposes as those described in the embodiments can be achieved. Furthermore, the present disclosure includes configurations obtained by adding a known technique to the configurations described in the embodiments.

The following details are derived from the above-described embodiments and the above-described modifications.

According to an aspect, an integrated circuit apparatus includes a first pad to which one of a power supply voltage and a ground voltage is supplied, a second pad to which the other of the power supply voltage and the ground voltage is supplied, a first transistor having a first gate to which a temperature control signal is input, a first drain electrically coupled to the first pad, and a first source electrically coupled to the second pad, a first drain coupling via wire that is a via wire electrically coupling the first pad to the first drain, and a first source coupling via wire that is a via wire electrically coupling the second pad to the first source. In plan view, the first drain overlaps the first pad and the first source overlaps the second pad.

In this integrated circuit apparatus, when the power supply voltage is supplied to the first pad, and the ground voltage is supplied to the second pad, current flows from the first pad to the drain of the first transistor through the first drain coupling via wire in a very short path. The current flows from the drain of the first transistor to the source of the first transistor through a short path and further flows from the source of the first transistor to the second pad through the first source coupling via wire in a very short path. Therefore, a path through which the current flows from the first pad to the second pad is short. When the power supply voltage is supplied to the second pad, and the ground voltage is supplied to the first pad, a path through which current flows from the second pad to the first pad is short. In addition, since the current flows in a direction orthogonal to the first pad and the second pad due to the first drain coupling via wire and the first source coupling via wire between the first and second pads and the first transistor, the cross-sectional areas of the wires through which the current flows are large. Therefore, according to this integrated circuit apparatus, parasitic resistance between the first and second pads and the first transistor is small, and it is possible to reduce the possibility that the current that flows in the first transistor may decrease due to the parasitic resistance between the first and second pads and the first transistor.

In addition, according to this integrated circuit apparatus, the cross-sectional areas of the wires through which the current flows between the first and second pads and the first transistor are large. Therefore, the integrated circuit apparatus is resistant to electromigration.

According to an aspect, in the integrated circuit apparatus, in plan view, the first gate, the first drain, and the first source may overlap the first pad and the second pad.

According to this integrated circuit apparatus, in a region in which the first gate, the first drain, and the first source overlap the first pad and the second pad in plan view, the first transistor including the drain having a large area and the source having a large area can be disposed, it is possible to increase current that flows in the first transistor. Therefore, it is possible to implement the integrated circuit apparatus that is small in size and in which a sufficient amount of current can flow.

According to an aspect, in the integrated circuit apparatus, the first pad and the second pad may be arranged side by side in a first direction that is a longitudinal direction of the first gate.

According to an aspect, the integrated circuit apparatus may include second to Nth transistors, second to Nth drain coupling via wires, and second to Nth source coupling via wires. N is an integer of 2 or greater. The first to Nth transistors may be arranged side by side in a second direction intersecting the first direction. An ith transistor among the second to Nth transistors may include an ith gate to which the temperature control signal is input, an ith drain electrically coupled to the first pad, and an ith source electrically coupled to the second pad, and i may be an integer greater than or equal to 2 and less than or equal to N. An ith drain coupling via wire among the second to Nth drain coupling via wires may be a via wire electrically coupling the first pad to the ith drain. An ith source coupling via wire among the second to Nth source coupling via wires may be a via wire electrically coupling the second pad to the ith source. In plan view, the ith drain may overlap the first pad, and the ith source may overlap the second pad.

According to this integrated circuit apparatus, when the power supply voltage is supplied to the first pad, and the ground voltage is supplied to the second pad, current flows from the first pad to the drain of the ith transistor through the ith drain coupling via wire in a very short path. The current flows from the drain of the ith transistor to the source of the ith transistor through a short path and further flows from the source of the ith transistor to the second pad through the ith source coupling via wire in a very short path. Therefore, a path through which the current flows from the first pad to the second pad is short. When the power supply voltage is supplied to the second pad, and the ground voltage is supplied to the first pad, a path through which current flows from the second pad to the first pad is short. In addition, since the current flows in a direction orthogonal to the first pad and the second pad due to the ith drain coupling via wire and the ith source coupling via wire between the first and second pads and the ith transistor, the cross-sectional areas of the wires through which the current flows are large. Therefore, according to this integrated circuit apparatus, parasitic resistance between the first and second pads and the ith transistor is small, and it is possible to reduce the possibility that the current that flows in the ith transistor may decrease due to the parasitic resistance between the first and second pads and the ith transistor. In addition, according to this integrated circuit apparatus, a large current can flow between the first pad and the second pad due to the number N of transistors.

Furthermore, according to this integrated circuit apparatus, the cross-sectional areas of the wires through which the current flows between the first and second pads and the first transistor are large. Therefore, the integrated circuit apparatus is resistant to electromigration.

According to an aspect, the integrated circuit apparatus may further include a temperature sensor and a third pad that outputs a signal from the temperature sensor. In a second direction intersecting the first direction, one of the first pad and the second pad and the third pad may be arranged side by side.

According to this integrated circuit apparatus, a dead space does not occur in the first direction in the vicinity of the first pad and the second pad due to the arrangement of the third pad and it is possible to easily bond the first pad and the second pad.

According to an aspect, the integrated circuit apparatus may further include a temperature sensor and a third pad that outputs a signal from the temperature sensor. In a second direction intersecting the first direction, the temperature sensor, the third pad, and the first transistor may be arranged side by side in order of the temperature sensor, the third pad, and the first transistor.

According to this integrated circuit apparatus, since the temperature sensor is located away from the first transistor, it is possible to prevent a temperature to be detected by the temperature sensor from rapidly changing due to a change in the amount of heat generated by the first transistor.

According to an aspect, the integrated circuit apparatus may further include a temperature sensor, and may be rectangular in plan view and have a first side and a second side opposite to the first side, and the first and second sides are short sides. The temperature sensor may be located closer to the first side than to the second side. The first transistor may be located closer to the second side than to the first side.

According to this integrated circuit apparatus, since the temperature sensor is located away from the first transistor, it is possible to prevent a temperature to be detected by the temperature sensor from rapidly changing due to a change in the amount of heat generated by the first transistor.

According to an aspect, in the integrated circuit apparatus, the power supply voltage may be supplied to the first pad, the ground voltage may be supplied to the second pad, and the first transistor may be an N-channel MOS transistor.

Since the N-channel MOS transistor has a higher ability to cause current to flow than that of a P-channel MOS transistor, a sufficient amount of current can flow in the first transistor according to this integrated circuit apparatus.

According to an aspect, an oscillator includes an integrated circuit apparatus, a resonator element whose temperature is controlled by the integrated circuit apparatus, and an oscillation circuit that causes the resonator element to oscillate. The integrated circuit apparatus includes a first pad to which one of a power supply voltage and a ground voltage is supplied, a second pad to which the other of the power supply voltage and the ground voltage is supplied, a transistor including a first gate to which a temperature control signal is input, a first drain electrically coupled to the first pad, and a first source electrically coupled to the second pad, a first drain coupling via wire that is a via wire electrically coupling the first pad to the first drain, and a first source coupling via wire that is a via wire electrically coupling the second pad to the first source. In plan view, the first drain overlaps the first pad, and the first source overlaps the second pad.

According to this oscillator, the integrated circuit apparatus in which a sufficient amount of current can flow in the first transistor can accurately control the temperature of the resonator element, and thus it is possible to output an oscillation signal with a highly accurate frequency.

According to an aspect, the oscillator may include a first container housing the integrated circuit apparatus, the resonator element, and the oscillation circuit.

According to an aspect, in the oscillator, the first container may include a substrate, a wall portion erected on a first surface of the substrate, and a leg portion erected on a second surface of the substrate, the first surface of the substrate and the wall portion may form a first housing space, the second surface of the substrate and the leg portion may form a second housing space, and the integrated circuit apparatus, the resonator element, and the oscillation circuit may be housed in the first housing space.

According to an aspect, in the oscillator, the first housing space may be hermetically sealed, and the second housing space may be open.

According to this oscillator, since the integrated circuit apparatus, the resonator element, and the oscillation circuit are hardly affected by outside air, and heat released from the integrated circuit apparatus is efficiently transmitted to the resonator element, it is possible to accurately control the temperature of the resonator element and output an oscillation signal with a highly accurate frequency.

According to an aspect, the oscillator may further include a second container housing the integrated circuit apparatus, the resonator element, and the oscillation circuit, and the second container may be housed in the first container.

According to this oscillator, since heat released from the integrated circuit apparatus is efficiently transmitted to the resonator element, it is possible to accurately control the temperature of the resonator element and output an oscillation signal with a highly accurate frequency.

What is claimed is:

1. An integrated circuit apparatus comprising:

a first pad to which one of a power supply voltage and a ground voltage is supplied;

a second pad to which the other of the power supply voltage and the ground voltage is supplied;

a first transistor having a first gate to which a temperature control signal is input, a first drain electrically coupled to the first pad, and a first source electrically coupled to the second pad;

a first drain coupling via wire that is a via wire electrically coupling the first pad to the first drain; and a first source coupling via wire that is a via wire electrically coupling the second pad to the first source, wherein in plan view, the first drain overlaps the first pad and the first source overlaps the second pad.

2. The integrated circuit apparatus according to claim 1, wherein in plan view, the first gate, the first drain, and the first source overlap the first pad and the second pad.

3. The integrated circuit apparatus according to claim 1, wherein the first pad and the second pad are arranged side by side in a first direction that is a longitudinal direction of the first gate.

4. The integrated circuit apparatus according to claim 3, further comprising:

second to Nth transistors;

second to Nth drain coupling via wires; and second to Nth source coupling via wires, N being an integer of 2 or greater, wherein the first to Nth transistors are arranged side by side in a second direction intersecting the first direction, an ith transistor among the second to Nth transistors includes an ith gate to which the temperature control signal is input, an ith drain electrically coupled to the first pad, and an ith source electrically coupled to the second pad, i being an integer greater than or equal to 2 and less than or equal to N, an ith drain coupling via wire among the second to Nth drain coupling via wires is a via wire electrically coupling the first pad to the ith drain, an ith source coupling via wire among the second to Nth source coupling via wires is a via wire electrically coupling the second pad to the ith source, and in plan view, the ith drain overlaps the first pad, and the ith source overlaps the second pad.

5. The integrated circuit apparatus according to claim 3, further comprising:

a temperature sensor; and a third pad that outputs a signal from the temperature sensor, wherein in a second direction intersecting the first direction, one of the first pad and the second pad and the third pad are arranged side by side.

6. The integrated circuit apparatus according to claim 3, further comprising:

a temperature sensor; and a third pad that outputs a signal from the temperature sensor, wherein in a second direction intersecting the first direction, the temperature sensor, the third pad, and the first transistor are arranged side by side in order of temperature sensor, the third pad, and the first transistor.

7. The integrated circuit apparatus according to claim 1, further comprising a temperature sensor, wherein the integrated circuit apparatus is rectangular in plan view and has a first side and a second side opposite to the first side, the first and second sides being short sides, the temperature sensor is located closer to the first side than to the second side, and the first transistor is located closer to the second side than to the first side.

8. The integrated circuit apparatus according to claim 1, wherein the power supply voltage is supplied to the first pad, the ground voltage is supplied to the second pad, and the first transistor is an N-channel MOS transistor.

9. An oscillator comprising:

an integrated circuit apparatus;

a resonator element whose temperature is controlled by the integrated circuit apparatus; and an oscillation circuit that causes the resonator element to oscillate, wherein the integrated circuit apparatus includes a first pad to which one of a power supply voltage and a ground voltage is supplied, a second pad to which the other of the power supply voltage and the ground voltage is supplied, a first transistor having a first gate to which a temperature control signal is input, a first drain electrically coupled to the first pad, and a first source electrically coupled to the second pad, a first drain coupling via wire that is a via wire electrically coupling the first pad to the first drain, and a first source coupling via wire that is a via wire electrically coupling the second pad to the first source, and in plan view, the first drain overlaps the first pad and the first source overlaps the second pad.

10. The oscillator according to claim 9, further comprising a first container housing the integrated circuit apparatus, the resonator element, and the oscillation circuit.

11. The oscillator according to claim 10, wherein the first container includes a substrate, a wall portion erected on a first surface of the substrate, and a leg portion erected on a second surface of the substrate, the first surface of the substrate and the wall portion form a first housing space, the second surface of the substrate and the leg portion form a second housing space, and the integrated circuit apparatus, the resonator element, and the oscillation circuit are housed in the first housing space.

12. The oscillator according to claim 11, wherein the first housing space is hermetically sealed and the second housing space is open.

13. The oscillator according to claim 10, further comprising a second container housing the integrated circuit apparatus, the resonator element, and the oscillation circuit, wherein the second container is housed in the first container.

* * * * *